(12) United States Patent
Nakajima et al.

(10) Patent No.: US 9,899,326 B2
(45) Date of Patent: Feb. 20, 2018

(54) SEMICONDUCTOR DEVICE WITH INHIBITED ELECTROMIGRATION AND MANUFACTURING METHOD THEREOF

(71) Applicant: Renesas Electronics Corporation, Tokyo (JP)

(72) Inventors: Akira Nakajima, Ibaraki (JP); Yoshiaki Yamamoto, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 24 days.

(21) Appl. No.: 14/923,978

(22) Filed: Oct. 27, 2015

(65) Prior Publication Data

US 2016/0141241 A1    May 19, 2016

(30) Foreign Application Priority Data

Nov. 19, 2014  (JP) .................................. 2014-235097

(51) Int. Cl.
| | |
|---|---|
| H01L 23/48 | (2006.01) |
| H01L 23/532 | (2006.01) |
| H01L 23/00 | (2006.01) |
| H01L 21/768 | (2006.01) |

(52) U.S. Cl.
CPC .. *H01L 23/53238* (2013.01); *H01L 21/76847* (2013.01); *H01L 21/76867* (2013.01); *H01L 21/76882* (2013.01); *H01L 24/05* (2013.01); *H01L 24/06* (2013.01); *H01L 2224/05553* (2013.01)

(58) Field of Classification Search
CPC ......... H01L 21/76867; H01L 21/76882; H01L 21/76847; H01L 23/53238; H01L 24/05; H01L 24/06
USPC .......................... 257/751, 762, 763, 773, 774
See application file for complete search history.

(56) References Cited

U.S. PATENT DOCUMENTS

| | | | |
|---|---|---|---|
| 7,422,977 B2 | 9/2008 | Higashi et al. | |
| 2006/0113685 A1* | 6/2006 | Ueki | ................. H01L 23/53233 257/785 |
| 2007/0082132 A1* | 4/2007 | Shinriki | .............. C23C 16/0245 427/255.394 |

FOREIGN PATENT DOCUMENTS

| | | |
|---|---|---|
| JP | 10-247649 A | 9/1998 |
| JP | 2006-165115 A | 6/2006 |

* cited by examiner

*Primary Examiner* — Hung Vu
(74) *Attorney, Agent, or Firm* — Mattingly & Malur, PC

(57) ABSTRACT

The reliability of a copper wire is improved without inhibiting the wiring resistance of the copper wire. For example, another metallic element segregates in the boundary region between a copper film CUF1 and a copper film CUF2, and at the upper side face part of a wiring gutter leading to the boundary region. In a sectional view, a metallic element having a reducing power higher than copper segregates at the inner part of the copper wire apart from both the surface of the copper wire and the bottom face of the wiring gutter and at the side face part of the copper wire. In a sectional view, a metallic element different from copper segregates in the vicinity of the center part of the copper wire and at the side face part of the copper wire.

10 Claims, 20 Drawing Sheets

SEMICONDUCTOR DEVICE WITH INHIBITED ELECTROMIGRATION AND MANUFACTURING METHOD THEREOF

CROSS-REFERENCE TO RELATED APPLICATIONS

The disclosure of Japanese Patent Application No. 2014-235097 filed on Nov. 19, 2014 including the specification, drawings and abstract is incorporated herein by reference in its entirety.

BACKGROUND

The present invention relates: to a semiconductor device and its manufacturing technology; and for example to a semiconductor device having a copper wire and a technology effectively applicable to the manufacturing technology of the semiconductor device.

In Japanese Unexamined Patent Application Publication No. 2006-165115 (Patent Literature 1), described is a technology of attempting to improve the electromigration resistance of a copper wire formed by a damascene method. Concretely, a copper wire contains an additive to improve adhesiveness between the copper wire and an insulating layer and the profile of the additive has a gradient of a concentration reducing from the top face toward the inner part of the copper wire and the concentration is set so as to be highest at the top face of the copper wire.

In Japanese Unexamined Patent Application Publication No. H10(1998)-247649 (Patent Literature 2), described is a technology of forming a columnar structure, which mainly includes a metal different from aluminum and traverses an aluminum wire in the longitudinal direction, in the aluminum wire in order to improve the electromigration resistance of the aluminum wire.

CITATION LIST

Patent Literature

Patent Literature 1: Japanese Unexamined Patent Application Publication No. 2006-165115
Patent Literature 2: Japanese Unexamined Patent Application Publication No. H10(1998)-247649

SUMMARY

The electromigration of copper caused by electric current is inhibited and the reliability of a copper wire is improved by slightly adding another metallic element to the copper wire.

When the miniaturization of a copper wire advances in order to materialize the downsizing and higher integration of a semiconductor device however, the density of the electric current flowing in the copper wire increases and hence the electromigration of copper is likely to be caused. As a result, the reliability of the copper wire deteriorates.

To cope with that, if the quantity of an added metallic element increases in order to inhibit electromigration in response to the increase of an electric current density caused by the miniaturization of a copper wire, the wiring resistance of the copper wire also increases. That is, the improvement of the reliability and the reduction of the wiring resistance of a copper wire are in the relationship of tradeoff. Ingenuity is therefore required in order to attempt to improve the reliability of a copper wire while the wiring resistance is inhibited from increasing substantially. That is, a room for improvement exists from the viewpoint of attaining both the reduction of wiring resistance and the improvement of reliability that are in the relationship of tradeoff.

Other problems and novel features will be obvious from the descriptions and attached drawings in the present specification.

In a semiconductor device according to an embodiment, a metallic element having a reducing power higher than copper segregates in a sectional view: at the inner part of a copper wire apart from both the surface of the copper wire and the bottom face of a wiring gutter; and at the side face part of the copper wire that is closer to the surface of the copper wire than the bottom face of the wiring gutter.

Further, in a semiconductor device according to an embodiment, a metallic element having a reducing power higher than copper segregates: in a plurality of discrete regions in a copper wire that are arranged discretely from the bottom face of a wiring gutter in the thickness direction of the copper wire and face the bottom face respectively; and at the side face part of the wiring gutter above the discrete region closest to the bottom face.

Furthermore, a manufacturing method of a semiconductor device according to an embodiment includes the steps of forming a first copper film containing a metallic element having a reducing power higher than copper over an insulating film including the inner wall of a wiring gutter by a sputtering method, applying a first annealing treatment, successively applying an oxidation treatment, forming a second copper film containing a metallic element over the first copper film by a sputtering method, and applying a second annealing treatment.

According to an embodiment, it is possible to attempt to improve the reliability of a copper wire while the wiring resistance of the copper wire is inhibited from increasing.

DETAILED DESCRIPTION

In the following embodiments, if necessary for convenience sake, each of the embodiments is explained by dividing it into plural sections or embodiments but, unless otherwise specified, they are not unrelated to each other and are in the relationship of one being a modified example, a detail, a supplemental explanation, or the like of a part or the whole of another.

Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Further in the following embodiments, it goes without saying that the constituent components (including a component step and others) are not necessarily essential except the cases of being specified and being obviously thought to be essential in principle and other cases.

Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the numerical value and the range.

Further, in all the drawings for explaining the embodiments, same members are represented with an identical code in principle and are not explained repeatedly. Here, hatching may sometimes be used even in a plan view in order to make a drawing easy to understand.

First Embodiment

Layout Configuration of Semiconductor Chip

Figure 1:
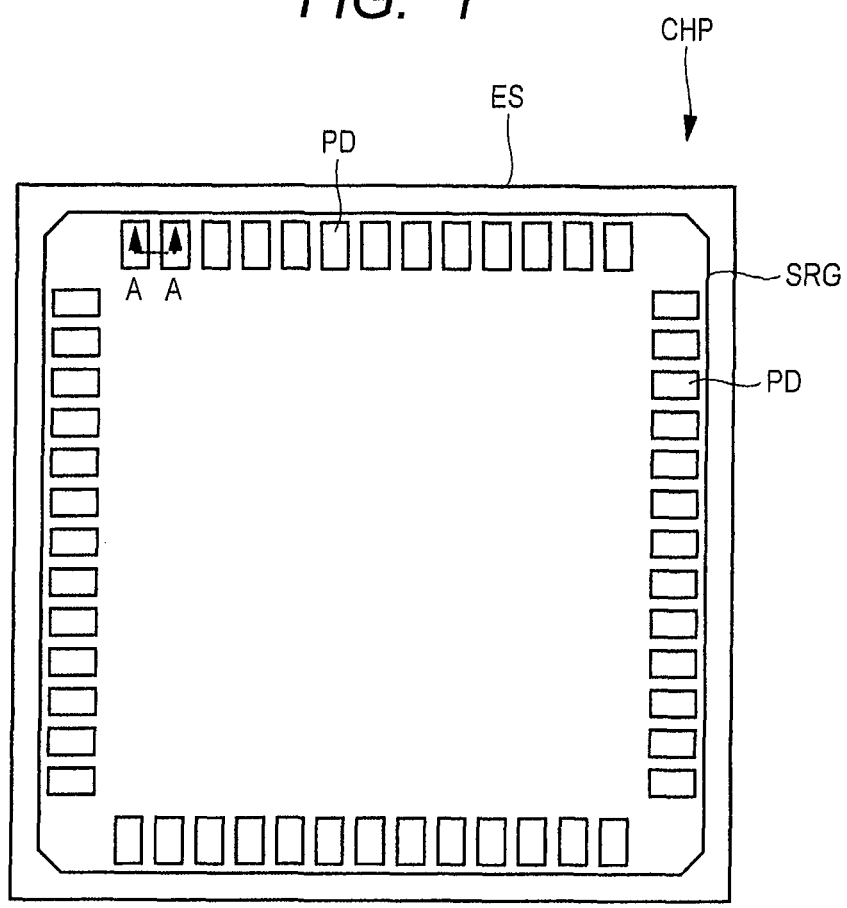
FIG. 1 is a view showing a layout configuration of a semiconductor chip.

FIG. 1 is a view showing a layout configuration of a semiconductor chip CHP. In FIG. 1, the semiconductor chip CHP has a rectangular shape for example and a plurality of pads PD are arranged along the sides ES of the semiconductor chip CHP. Concretely, as shown in FIG. 1, a seal ring SRG is formed inside the sides ES along the sides ES of the rectangular semiconductor chip CHP and the pads PD are arranged inside the seal ring SRG along the sides ES of the semiconductor chip CHP. In each of the pads PD, although it is not shown in FIG. 3, whereas the most part of the surface of a pad PD is exposed through an opening formed in a surface protective film, the end of the pad PD is covered with the surface protective film.

<Sectional Configuration of Semiconductor Chip>

Figure 2:
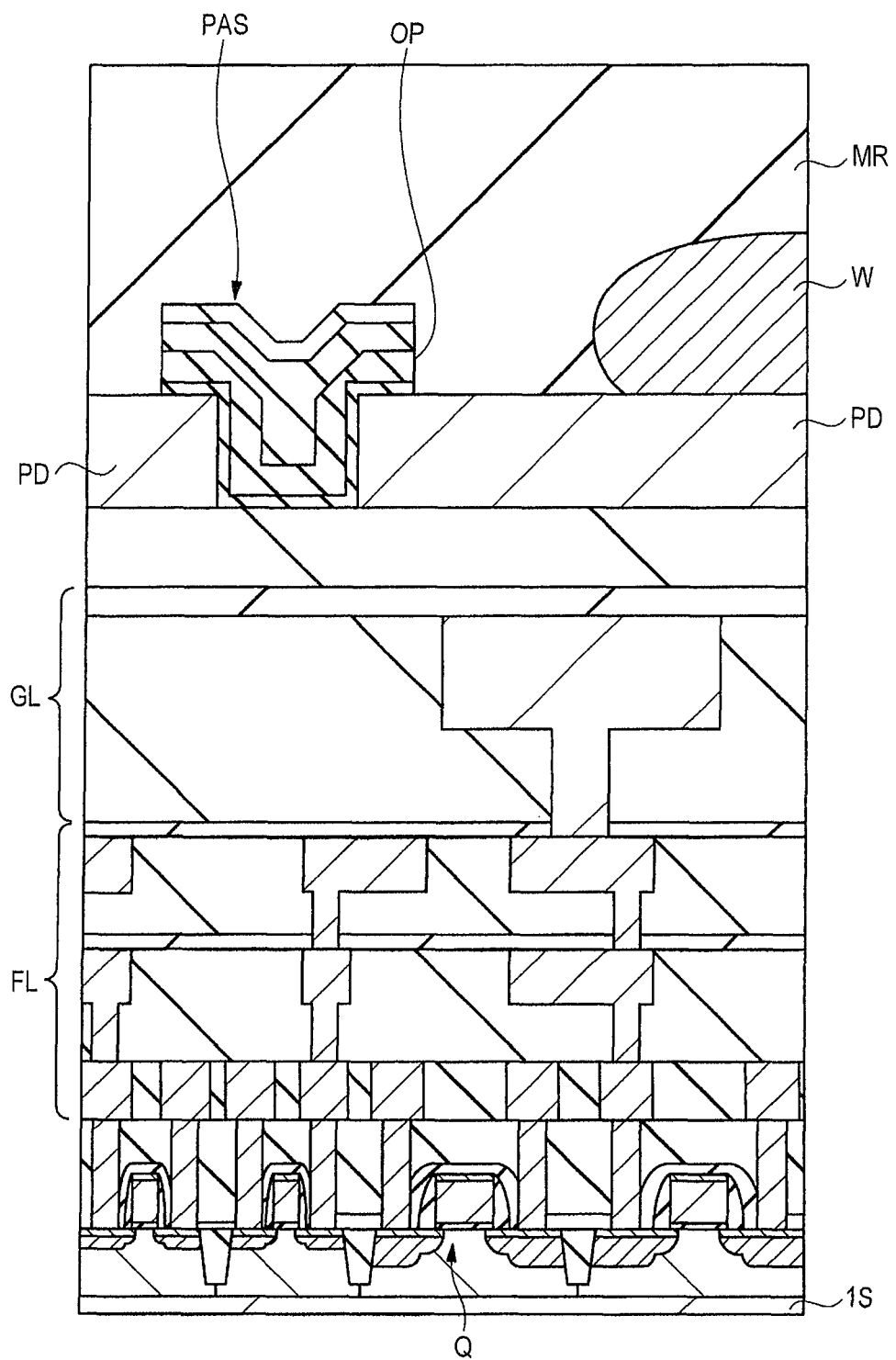
FIG. 2 is a sectional view taken on line A-A of FIG. 1.

Successively, the schematic sectional configuration of a semiconductor chip is explained. FIG. 2 is a sectional view taken on line A-A of FIG. 1. As shown in FIG. 2, a field-effect transistor Q that is an example of a semiconductor element is formed over a semiconductor substrate 1S including silicon for example and a fine layer FL including a fine copper wire is formed above the field-effect transistor Q for example. Then a global layer GL including a copper wire having a width larger than the copper wire including the fine layer FL is formed above the fine layer FL. A plurality of pads PD are formed above the global layer GL. Although it is not shown in FIG. 2, the pads PD and the global layer GL are coupled to each other through plugs for example. Then as shown in FIG. 2, the pads PD are coupled electrically to the field-effect transistor Q formed over the semiconductor substrate 1S through the global layer GL and the fine layer FL.

Successively, as shown in FIG. 2, a surface protective film PAS is formed so as to cover the pads PD and fill the space between the pads PD. Then openings OP are formed in the surface protective film PAS and parts of the surfaces of the pads PD are exposed from the bottom parts of the openings OP. A wire W including a gold wire is coupled to the surfaces of the pads PD exposed from the openings OP for example and the surface protective film PAS including the surface of the pad PD to which the wire W is coupled is covered with a resin MR for example.

<Configuration of Copper Wire Including Fine Layer>

Figure 3:
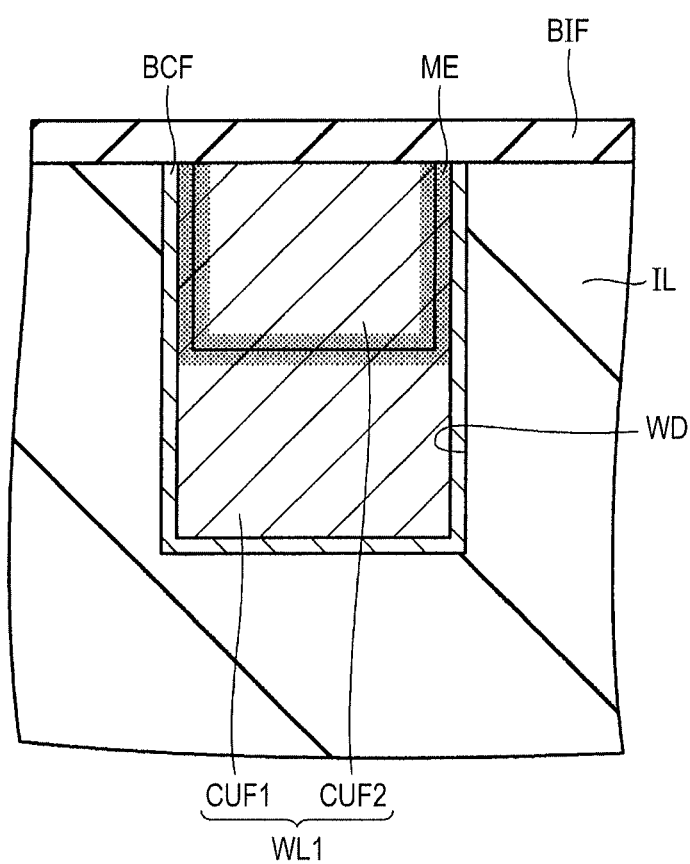
FIG. 3 is a sectional view enlargedly showing a copper wire including a fine layer.

The technological thought in First Embodiment lies in the configuration of a copper wire including such a fine layer FL as described above and hence the configuration of a copper wire including a fine layer FL is explained hereunder. FIG. 3 is a sectional view enlargedly showing a copper wire WL1 including a fine layer FL according to First Embodiment. In FIG. 3, a copper wire WL1 according to First Embodiment is formed by a damascene method for example. Concretely, a copper wire WL1 according to First Embodiment is configured as follows. That is, as shown in FIG. 3, a wiring gutter WD is formed in an interlayer insulating film IL including a film having a permittivity lower than a silicon oxide film represented by an SiOC film for example. Then a barrier conductor film BCF including a tantalum nitride film and a tantalum film formed over the tantalum nitride film is formed over the inner wall of the wiring gutter WD for example and a copper wire WL1 is formed so as to fill the wiring gutter WD with the barrier conductor film BCF interposed. On this occasion, the copper wire WL1 according to First Embodiment includes a copper film CUF1 embedded into the lower part of the wiring gutter WD and a copper film CUF2 embedded into the upper part of the wiring gutter WD and a metallic element having a reducing power higher than copper segregates in a boundary region between the copper film CUF1 and the copper film CUF2 and at the upper side face part of the wiring gutter WD. That is, in a sectional view, the metallic element having a reducing power higher than copper precipitates in the vicinity of the center part of the copper wire WL1 embedded into the wiring gutter WD and at the upper side face part of the wiring gutter WD leading to the vicinity of the center part.

Fundamental Thought in First Embodiment

The fundamental thought according to the present embodiment is explained here. For example, a copper wire WL1 including a fine layer FL is miniaturized and electromigration caused by electric current flowing in the copper wire WL1 becomes obvious in the miniaturized copper wire WL1. For the reason, in the miniaturized copper wire WL1 including the fine layer FL, electromigration is inhibited by adding another metallic element slightly to copper that is the main component. That is, by adding another metallic element to copper that is the main component, the displacement of the added metallic element to a one-way electric current is different from the displacement of copper and resultantly the electromigration caused by the one-way displacement of copper can be inhibited.

Meanwhile, if the miniaturization of a copper wire WL1 advances to the extent that a wiring width is 60 nm or less for example, a current density in the copper wire WL1 increases and hence electromigration is likely to appear. From this, it is necessary to increase the quantity of a metallic element added to copper that is the main component in proportion to the advancement of the miniaturization of the copper wire WL1 in order to effectively inhibit the electromigration. It is estimated that electromigration can be inhibited effectively by the measure in the miniaturized copper wire WL1 but on the other hand the side effect that the wiring resistance of the copper wire WL1 increases when the quantity of a metallic element added to copper that is the main component increases appears. That is, although it is effective to increase the quantity of a metallic element added to copper that is the main component from the viewpoint of effectively inhibiting electromigration in a miniaturized copper wire WL1, the wiring resistance of the copper wire WL1 increases undesirably on this occasion.

An object of the fundamental thought in First Embodiment therefore is to obtain both the inhibition of electromigration and the inhibition of wiring resistance, which are in the relationship of tradeoff, to the greatest possible extent. Then the fundamental thought in First Embodiment is the basis for materializing the ingenuity of inhibiting electromigration appearing in a copper wire WL1 while a wiring resistance is inhibited from increasing. Concretely, the fundamental thought in First Embodiment is to add another metallic element concentrically to a part of a copper wire WL1 where electromigration is likely to appear. That is, the fundamental thought in First Embodiment is to add a metallic element selectively to a part where the electromigration resistance is weak without changing the quantity of the metallic element added to the whole copper wire WL1. As a result, since another metallic element is added to a part of the copper wire WL1 where the electromigration resistance is weak, it is possible to: attempt to improve the electromigration resistance; and thus improve the electromigration resistance of the whole copper wire WL1. Meanwhile, since the quantity of a metallic element added to the whole copper wire WL1 does not change in the fundamental thought in First Embodiment, it is possible to inhibit the increase of wiring resistance caused by the increase of the added metallic element. That is, by the fundamental thought in First Embodiment, it is possible to obtain a conspicuous effect that the electromigration resistance of a copper wire WL1 can be improved without incurring the increase of wiring resistance to the greatest possible extent even when the copper wire WL1 is miniaturized. That is, by the fundamental thought in First Embodiment, it is possible to obtain an excellent effect that both the improvement of electromigration resistance and the inhibition of the increase of wiring resistance, which are in the relationship of tradeoff, are obtained. The feature of the configuration of a copper wire WL1 in which the fundamental thought in First Embodiment is embodied is explained hereunder.

Structural Feature in First Embodiment

A feature point of First Embodiment is that, as shown in FIG. 3 for example, another metallic element ME segregates in a boundary region between a copper film CUF1 and a copper film CUF2, which include a copper wire WL1, and at the upper side face part of a wiring gutter WD leading to the boundary region. That is, a feature point of First Embodiment is that a metallic element ME having a reducing power higher than copper segregates in a sectional view: at the inner part of a copper wire WL1 apart from both the surface of the copper wire WL1 and the bottom face of a wiring gutter WD; and at the side face part of the copper wire WL1 that is closer to the surface of the copper wire WL1 than the bottom face of the wiring gutter WD. Concretely for example, the feature point is that a metallic element ME that is different from copper segregates, in a sectional view shown in FIG. 3, in the vicinity of the center part of a copper wire WL1 and at the side face part of the copper wire WL1 above the vicinity of the center part. As a result, in a copper wire WL1 shown in FIG. 3, the fundamental thought in First Embodiment of concentrically accumulating a metallic element ME in a partial region of the copper wire WL1 is embodied.

In the sectional view shown in FIG. 3, since electric current flows abundantly in the vicinity of the center part of a copper wire WL1 in particular, electromigration is likely to appear in the vicinity of the center part. In First Embodiment in this regard, since a metallic element ME segregates concentrically in the vicinity of the center part of a copper wire WL1, it is possible to improve electromigration resistance in the vicinity of the center part of the copper wire WL1 in which electric current is likely to flow. As a result, by a copper wire WL1 according to First Embodiment, it is possible to effectively improve electromigration resistance at a site where a large current flows.

Further, in the sectional view shown in FIG. 3, the upper side face part of a copper wire WL1 is likely to be peeled from an interlayer insulating film IL. Then if exfoliation occurs between the copper wire WL1 and the interlayer insulating film IL, the effect of fixing the copper wire WL1 by the interlayer insulating film IL reduces and hence the copper wire WL1 is likely to be displaced at a exfoliated site. This means that electromigration is likely to appear at the exfoliated site. By segregating a metallic element ME at the upper side face part of a copper wire WL1 where exfoliation from an interlayer insulating film IL is likely to occur therefore, it is possible to improve electromigration resistance at the upper side face part of the copper wire WL1.

In this way, the feature point of First Embodiment is firstly that a metallic element ME that is different from copper segregates in the vicinity of the center part of a copper wire WL1 in consideration of the fact that electromigration is likely to appear in the vicinity of the center part where electric current flows abundantly (first configuration). Successively, the metallic element ME that is different from copper segregates at the upper side face part of the copper wire WL1 in consideration of the fact that electromigration is likely to appear at the upper side face part of the copper wire WL1 (the upper side face part of a wiring gutter WD) where exfoliation from an interlayer insulating film IL is likely to occur (second configuration). As a result, according to First Embodiment, a site having a low electromigration resistance is fortified by positively segregating a metallic element having the function of inhibiting electromigration at the site of a copper wire WL1 where the electromigration resistance is relatively low. As a result, according to First Embodiment, the electromigration resistance at a site where the electromigration resistance is low improves in the copper wire WL1 and hence it is possible to improve the electromigration resistance of the whole copper wire WL1.

Meanwhile, whereas a metallic element ME segregates concentrically in a partial region where electromigration resistance is low in a copper wire WL1 according to First Embodiment, the metallic element ME does not segregate in the other region where the electromigration resistance is relatively high. This means that the quantity of a metallic element ME added to a whole copper wire WL1 may not increase. That is, it means that, according to First Embodiment, it is possible to segregate a metallic element ME concentrically in a partial region where electromigration resistance is low while the quantity of the metallic element ME added to a whole copper wire WL1 is kept constant. As a result, in a copper wire WL1 according to First Embodiment, it is possible to configure the copper wire WL1 so as not to increase the quantity of a metallic element ME added to the whole copper wire WL1 and hence it is possible to inhibit the increase of wiring resistance caused by the increase of the quantity of the added metallic element ME that is different from copper. That is, according to the feature point of First Embodiment, it is possible to improve the electromigration resistance of a whole copper wire WL1 while the wiring resistance of the copper wire WL1 is inhibited from increasing.

In this way, the technological thought in First Embodiment is based on the fundamental thought of adding a metallic element selectively at a part where electromigration resistance is low while the quantity of the metallic element added to a whole copper wire WL1 is not changed. Then the technological thought in First Embodiment, while it is based on the fundamental thought, has the feature point including the first configuration and the second configuration stated earlier by finding out that the vicinity of the center part and the upper side face part of a copper wire WL1 exist as sites where electromigration resistance is low. As a result, according to the feature point of First Embodiment, because the fundamental thought is reflected, even when a copper wire WL1 is miniaturized, it is possible to improve the electromigration resistance of the copper wire WL1 without increasing the wiring resistance. That is, according to the feature point of First Embodiment, it is possible to attain both the improvement of electromigration resistance and the inhibition of the increase of wiring resistance, which are in the relationship of tradeoff. As a result, by a semiconductor device according to First Embodiment, it is possible to obtain a conspicuous effect that it is possible to attempt to improve the reliability of the semiconductor device while the performance of the semiconductor device is attempted to improve.

Here, as a metallic element added to copper that is the main component, titanium (Ti), manganese (Mn), tin (Sn), nickel (Ni), iron (Fe), zinc (Zn), or magnesium (Mg) can be named for example.

<Manufacturing Method of Semiconductor Device>

A semiconductor device according to First Embodiment is configured as stated above and a manufacturing method of the semiconductor device is explained hereunder in reference to drawings. In particular, in a sectional view shown in FIG. 3, a manufacturing method of a semiconductor device capable of segregating a metallic element ME that is different from copper in the vicinity of the center part of a copper wire WL1 and at the side face part of the copper wire WL1 located above the vicinity of the center part is explained.

Figure 4:
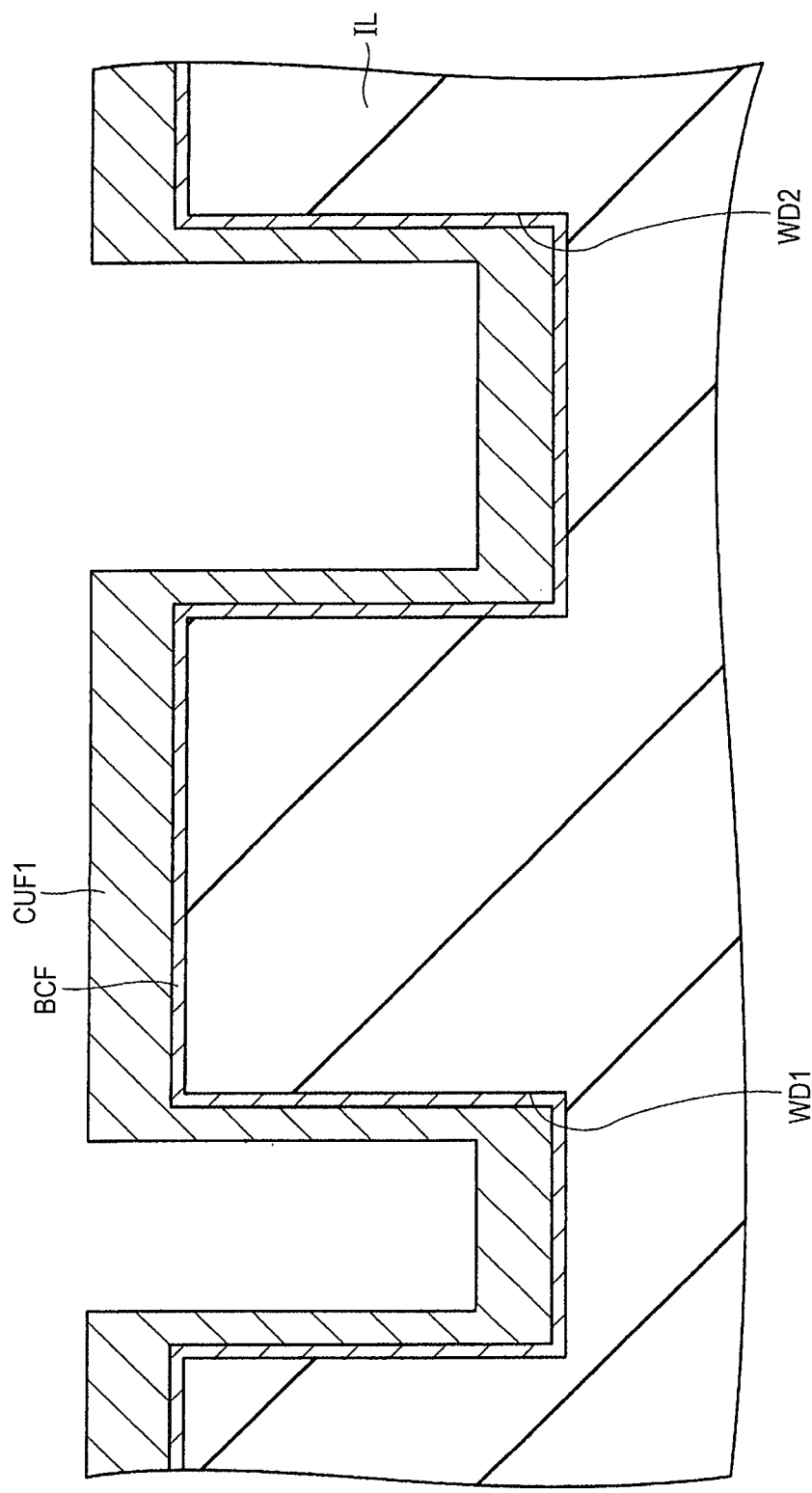
FIG. 4 is a sectional view showing a manufacturing process of a semiconductor device according to First Embodiment.

Firstly, after a field-effect transistor is formed over a semiconductor substrate, an interlayer insulating film including a low permittivity film (SiOC film or the like) having a permittivity lower than a silicon oxide film for example is formed above the semiconductor substrate covering the field-effect transistor. Then as shown in FIG. 4, a wiring gutter WD1 and a wiring gutter WD2 having a width larger than the wiring gutter WD1 are formed in the interlayer insulating film IL by a photolithography technology and an etching technology. Concretely, for example, whereas the wiring width of the wiring gutter WD1 is 60 nm or less, the wiring width of the wiring gutter WD2 is 100 nm or more. Successively, the semiconductor substrate (semiconductor wafer) is carried in a sputtering device and a barrier conductor film BCF including a tantalum nitride film and a tantalum film formed over the tantalum nitride film for example is formed over the interlayer insulating film IL including the inner wall of the wiring gutter WD1 and the inner wall of the wiring gutter WD2 by a sputtering method.

Successively, in the state of carrying the semiconductor substrate in the sputtering device, by a sputtering method using a target containing copper and a metallic element having a reducing power higher than copper, a copper film CUF1 containing the metallic element having a reducing power higher than copper is formed over the interlayer insulating film IL including the inner wall of the wiring gutter WD1 and the inner wall of the wiring gutter WD2 while the barrier conductor film BCF is interposed. Here, as the metallic element having a reducing power higher than copper, aluminum (Al), titanium (Ti), manganese (Mn), tin (Sn), nickel (Ni), iron (Fe), zinc (Zn), or magnesium (Mg) can be named for example. A metallic element having a reducing power higher than copper can also be called, in other words, a metallic element having an ionization tendency higher than copper.

Figure 5:
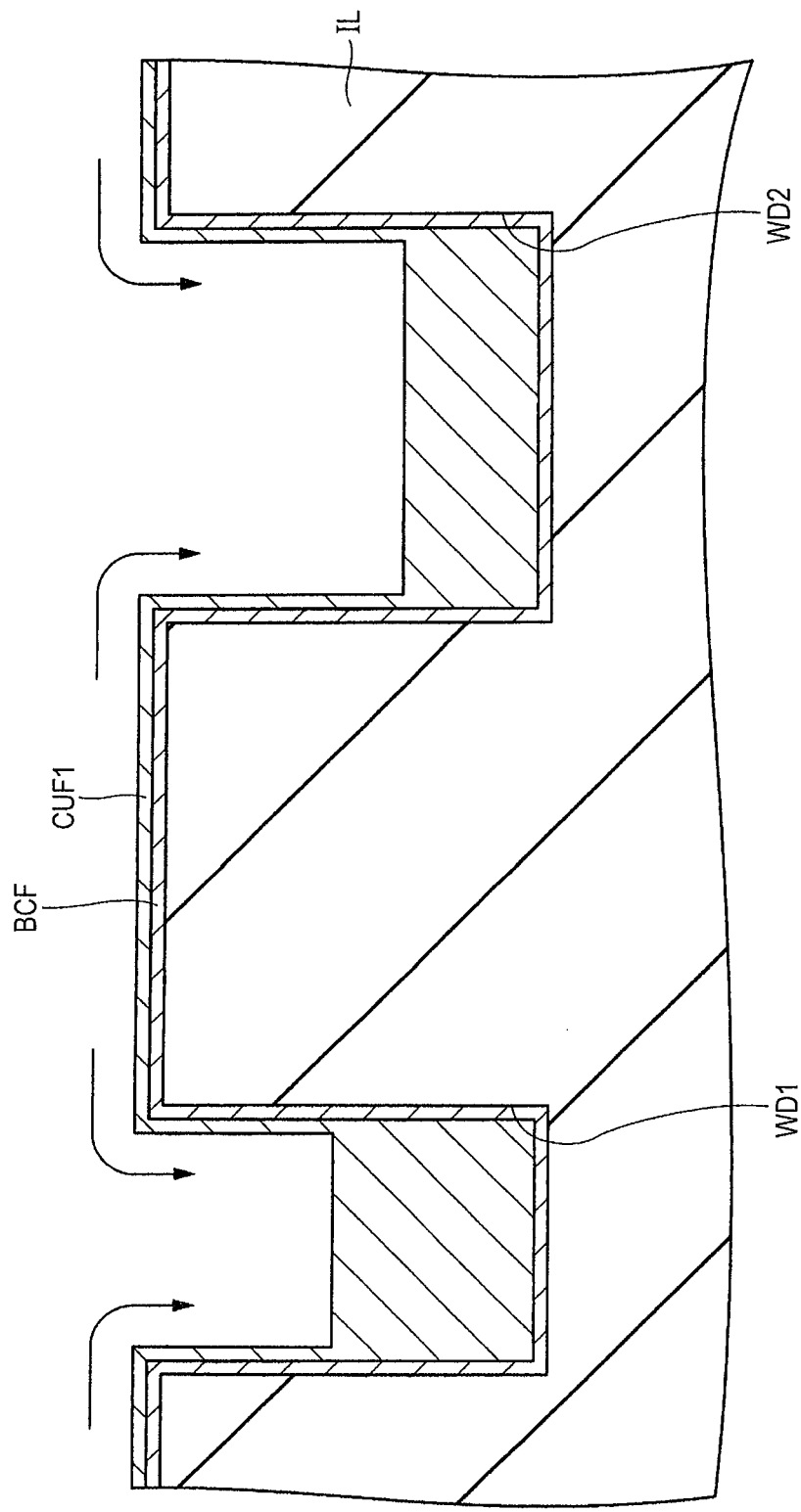
FIG. 5 is a sectional view showing a manufacturing process subsequent to FIG. 4 of the semiconductor device.

Successively, in the state of carrying the semiconductor substrate in the sputtering device, as shown in FIG. 5, an annealing treatment (heat treatment) is applied to the semiconductor substrate. As a result, the film thickness of the copper film CUF1 formed at the inner part of the wiring gutter WD1 and the inner part of the wiring gutter WD2 is increased from the film thickness before the annealing treatment by pouring a part of the copper and a part of the metallic element, those including the copper film CUF1, from over the interlayer insulating film IL into the inner part of the wiring gutter WD1 and the inner part of the wiring gutter WD2. The fluidity of the copper film CUF1 increases by the annealing treatment and resultantly the copper and the metallic element including the copper film CUF1 flow into the bottom part of the wiring gutter WD1 and the bottom part of the wiring gutter WD2. On this occasion, the film thickness of the copper film CUF1 formed by the sputtering method is adjusted so that about a half of the wiring gutter WD1 may be filled. Further, the annealing temperature can be set at 300° C. or higher to 400° C. or lower for example. Although the example of applying the annealing treatment after the copper film CUF1 is formed is shown in First Embodiment, the application of the annealing treatment is not limited to the example and it is also possible to apply the annealing treatment during a sputtering process for forming the copper film CUF1.

Figure 6:
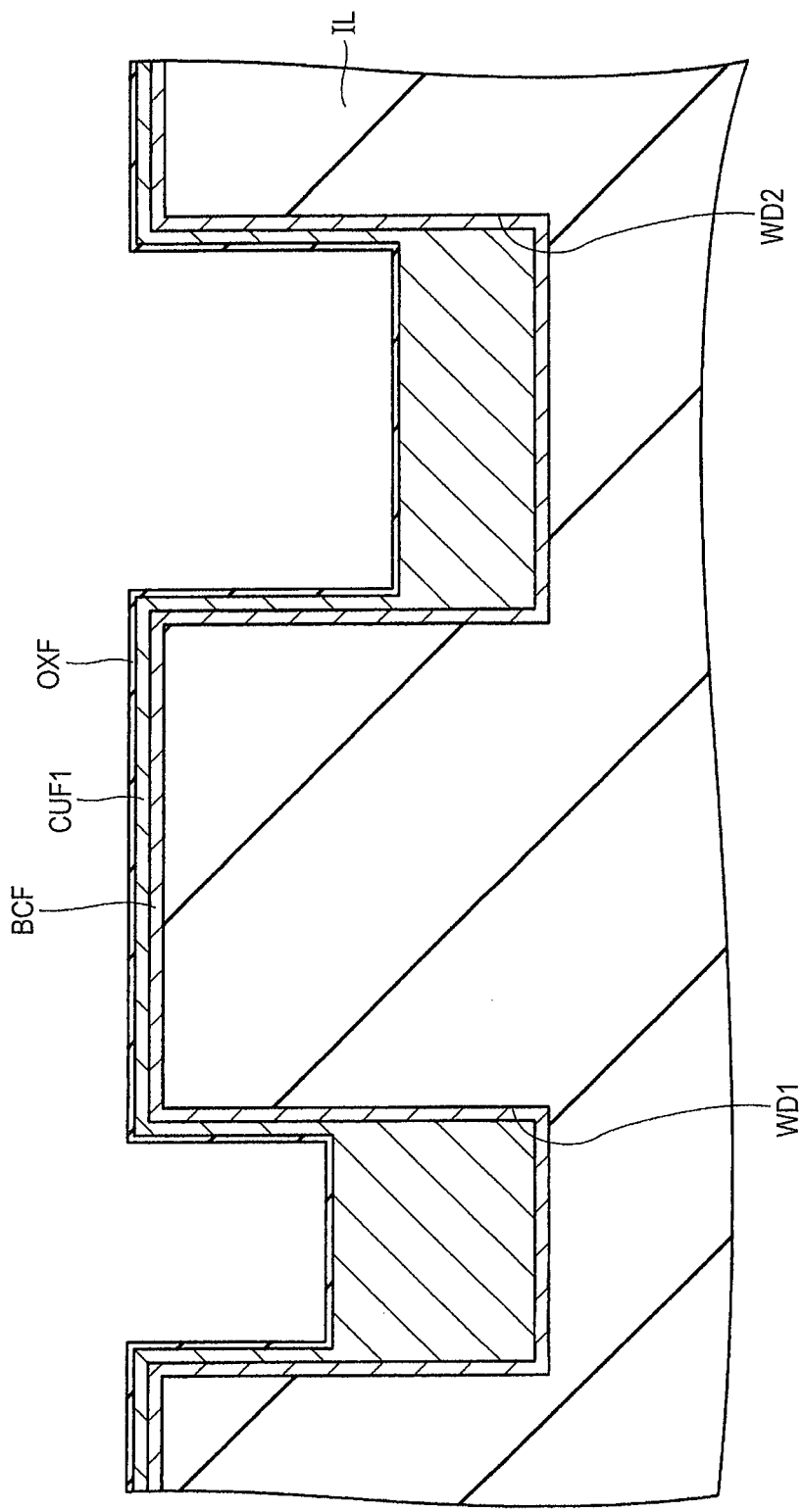
FIG. 6 is a sectional view showing a manufacturing process subsequent to FIG. 5 of the semiconductor device.

Successively, an atmospheric exposure treatment is applied by carrying the semiconductor substrate from the sputtering device to the exterior. The atmospheric exposure treatment is a kind of oxidation treatment and the surface of the copper film CUF1 is oxidized by the atmospheric exposure treatment as shown in FIG. 6. That is, at the surface of the copper film CUF1, copper binds to oxygen and copper oxide is formed. Namely a copper oxide film OXF is formed over the surface of the copper film CUF1. Concretely, as shown in FIG. 6, the surface of the copper film CUF1 formed at the center part and the upper side face part of the wiring gutter WD1 is oxidized and the surface of the copper film CUF1 formed at the lower center part and the upper side face part of the wiring gutter WD2 is oxidized.

Figure 7:
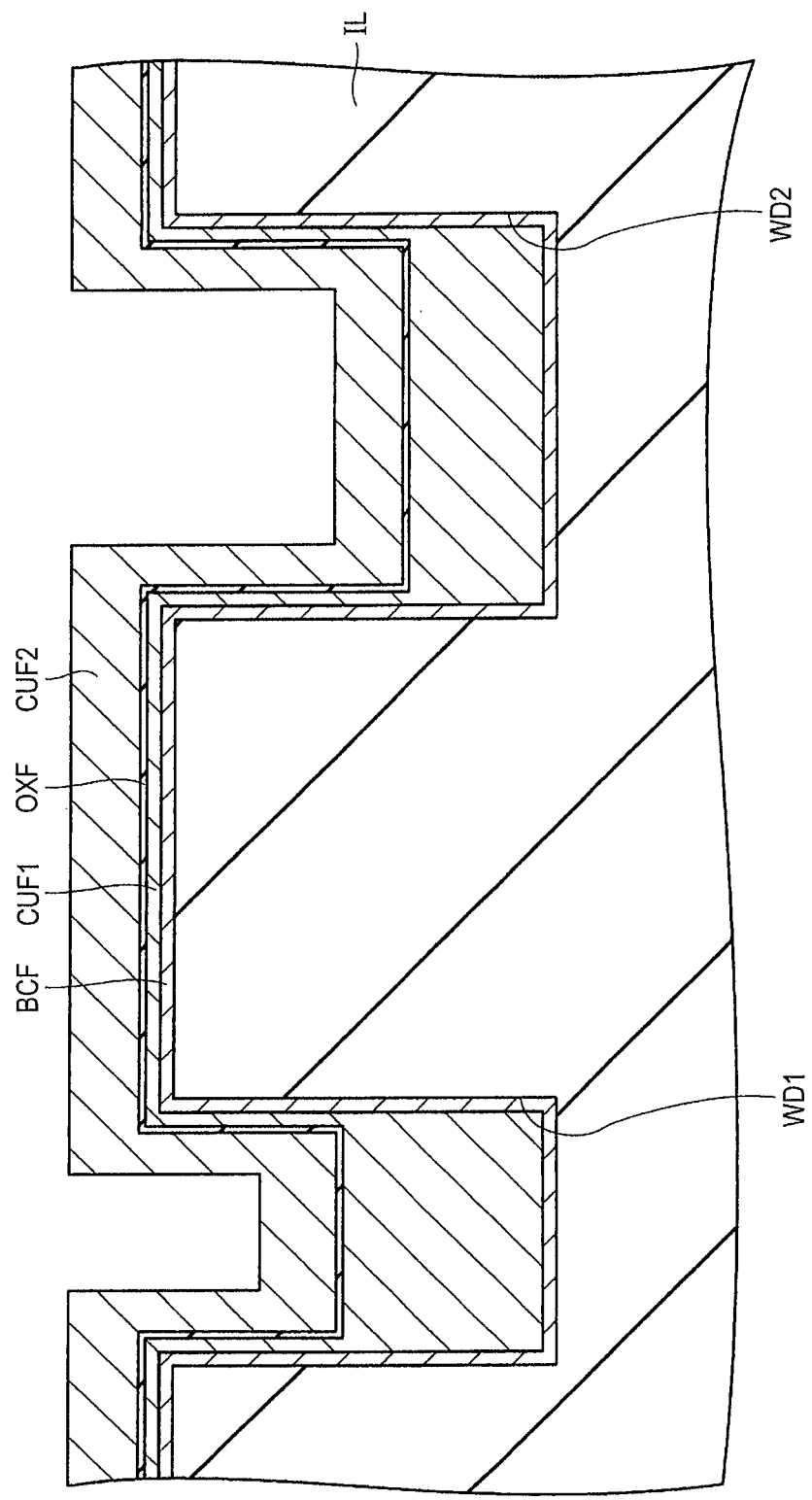
FIG. 7 is a sectional view showing a manufacturing process subsequent to FIG. 6 of the semiconductor device.

Successively, after the semiconductor substrate is carried in the sputtering device again, as shown in FIG. 7, a copper film CUF2 containing a metallic element having a reducing power higher than copper is formed over the copper film CUF1 by a sputtering method using a target containing copper and the metallic element having a reducing power higher than copper. Here, as the metallic element having a reducing power higher than copper, aluminum (Al), titanium (Ti), manganese (Mn), tin (Sn), nickel (Ni), iron (Fe), zinc (Zn), or magnesium (Mg) can be named for example.

Figure 8:
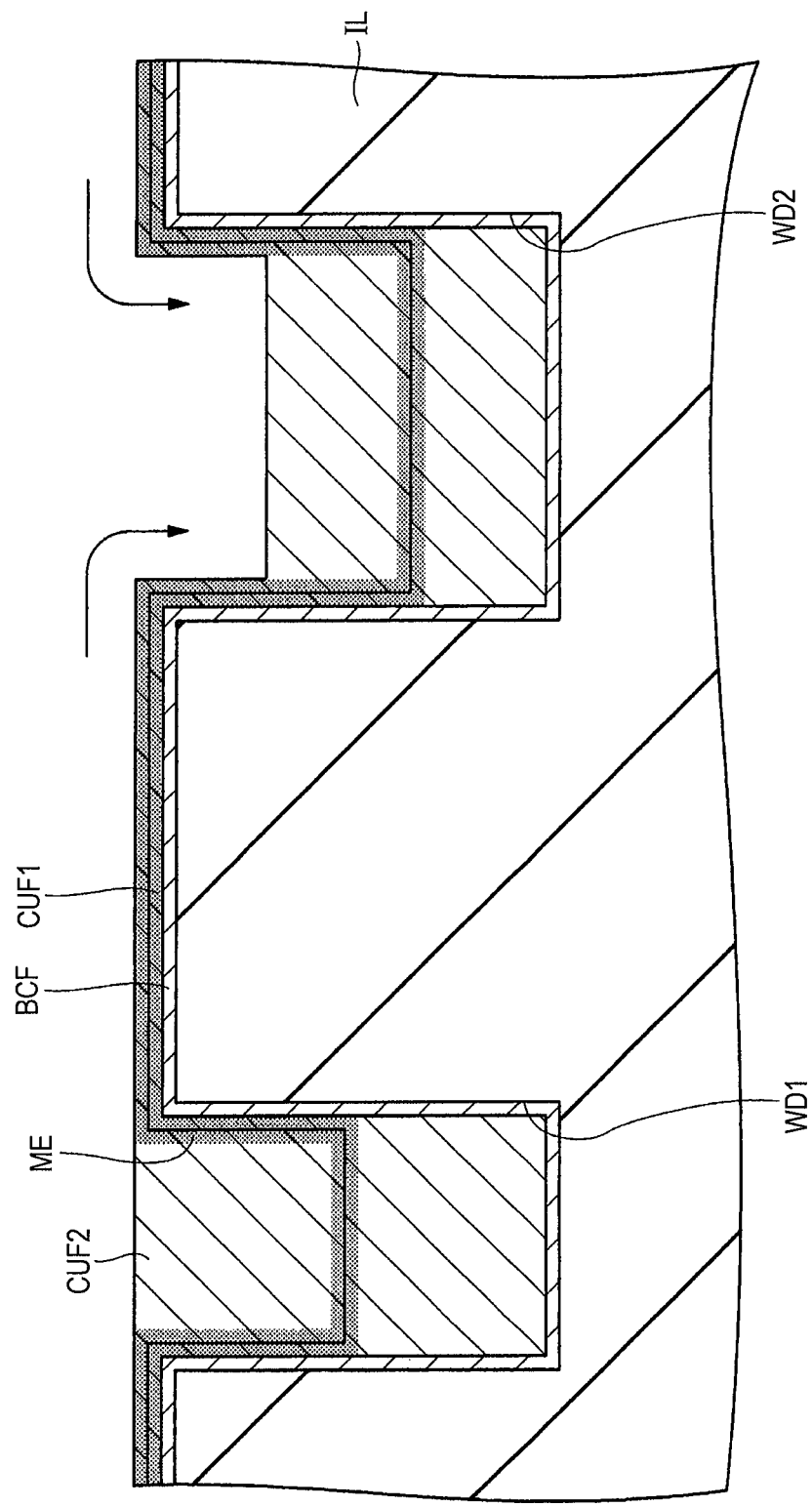
FIG. 8 is a sectional view showing a manufacturing process subsequent to FIG. 7 of the semiconductor device.

Successively, in the state of carrying the semiconductor substrate in the sputtering device, as shown in FIG. 8, an annealing treatment (heat treatment) is applied to the semiconductor substrate. As a result, the film thicknesses of the copper film CUF2 formed at the inner part of the wiring gutter WD1 and the inner part of the wiring gutter WD2 are increased from the film thicknesses before the annealing treatment by pouring a part of the copper and a part of the metallic element, those including the copper film CUF2, from over the copper film CUF1 formed over the interlayer insulating film IL into the inner part of the wiring gutter WD1 and the inner part of the wiring gutter WD2. As a result, the wiring gutter WD1 is filled completely with the copper film CUF1 and the copper film CUF2. In contrast, the wiring gutter WD2 is not completely filled with the copper film CUF1 and the copper film CUF2 because the wiring width of the wiring gutter WD2 is wider than that of the wiring gutter WD1. The annealing temperature at the annealing treatment can be set at 300° C. or higher to 400° C. or lower for example. Although the example of applying the annealing treatment after the copper film CUF2 is formed is shown in First Embodiment, the application of the annealing treatment is not limited to the example and it is also possible to apply the annealing treatment during a sputtering process for forming the copper film CUF2.

Here, by the annealing treatment to fluidize the copper film CUF2, the metallic element ME contained in the already-formed copper film CFU1 and the metallic element ME contained in the copper film CFU2 segregate at the interface between the copper film CFU1 and the copper film CFU2 at the inner part of the wiring gutter WD1. Likewise, the metallic element ME contained in the already-formed copper film CFU1 and the metallic element ME contained in the copper film CFU2 segregate at the interface between the copper film CFU1 and the copper film CFU2 at the inner part of the wiring gutter WD2 too. When attention is focused on the wiring gutter WD1 having a narrower wiring width, in the sectional view shown in FIG. 8, the metallic element having a reducing power higher than copper segregates at the center part of the wiring gutter WD1 and the side face part above the center part of the wiring gutter WD1.

The mechanism is explained hereunder. In First Embodiment, the surface of the copper film CUF1 is oxidized by the atmospheric exposure treatment. That is, at the surface of the copper film CUF1, copper binds to oxygen and copper oxide is formed. Successively, the copper film CUF2 is formed over the copper film CUF1 and the annealing treatment is applied. On this occasion, the metallic element ME is contained in the copper film CUF1 and the copper film CUF2 and the metallic element ME has a reducing power higher than copper and hence has the function of taking oxygen out of copper oxide and reducing copper. That is, the metallic element ME having a reducing power higher than copper takes oxygen out of copper oxide and hence gathers around the copper oxide existing at the interface between the copper film CUF1 and the copper film CUF2 where the copper oxide is formed. As a result, when attention is focused on the wiring gutter WD1 for example, the metallic element ME segregates in the vicinity of the center part and at the side face part above the vicinity of the center part of the wiring gutter WD1 where the copper oxide is formed. That is, when attention is focused on the wiring gutter WD1, the metallic element ME segregates in the vicinity of the center part and at the side face part above the vicinity of the center part of the wiring gutter WD1 where the copper oxide is formed. Then the segregating metallic element ME takes oxygen out of the copper oxide and binds to oxygen by itself, thus the copper oxide is reduced to copper, and the metallic element ME binds to oxygen and is oxidized.

In this way, according to First Embodiment, in the wiring gutter WD1 having a narrower wiring width, it is possible to segregate a metallic element having a reducing power higher than copper in the boundary region between the copper film CUF1 and the copper film CUF2 apart from both the surface of the copper film CUF2 and the bottom face of the wiring gutter WD1 and at the side face part of the copper film CUF2 closer to the surface of the copper film CUF2 than the bottom face of the wiring gutter WD1. Concretely for example, according to First Embodiment, it is possible to segregate the metallic element ME having a reducing power higher than copper at the center part of the wiring gutter WD1 and at the side face part above the center part of the wiring gutter WD1.

Figure 9:
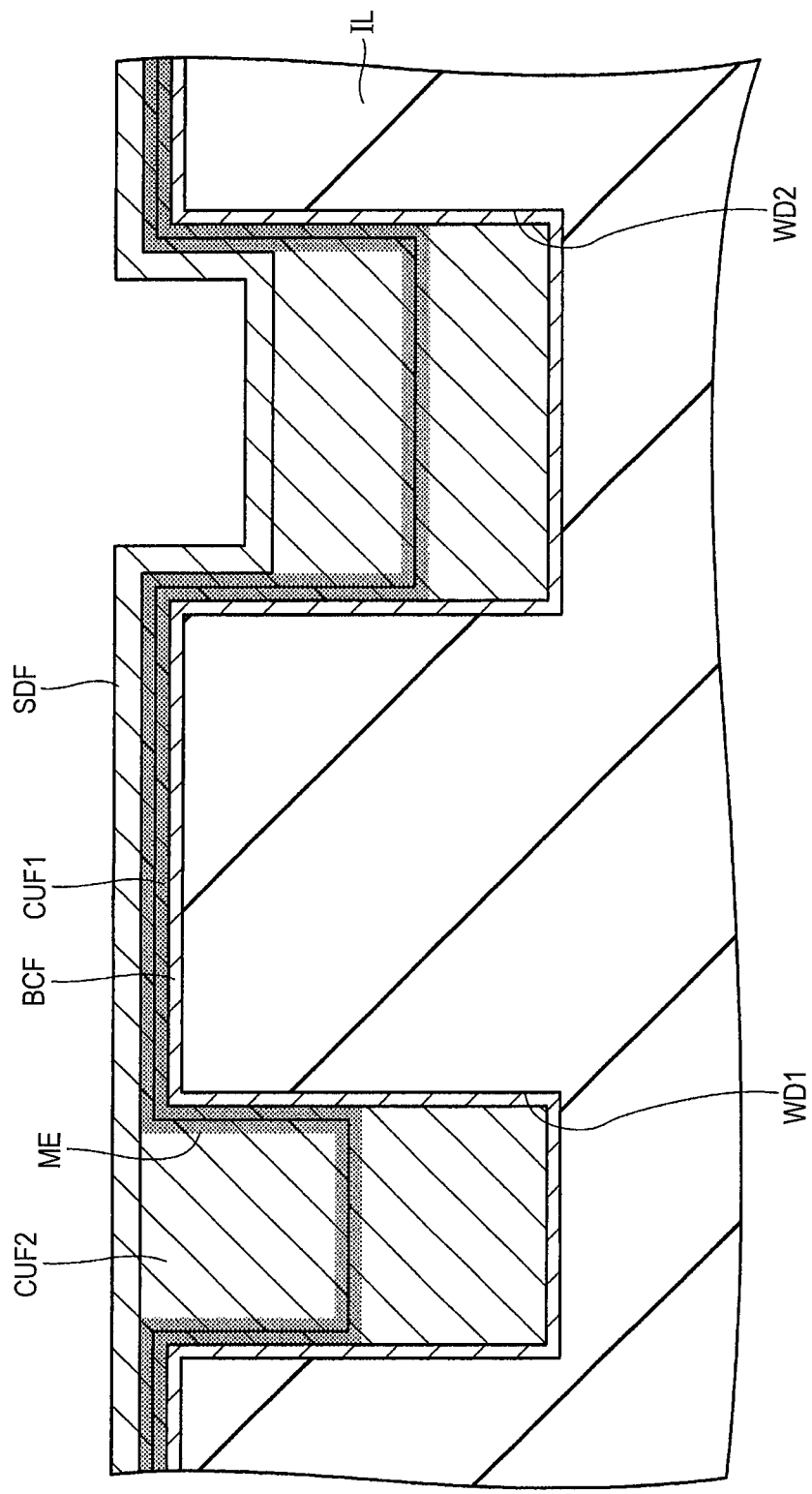
FIG. 9 is a sectional view showing a manufacturing process subsequent to FIG. 8 of the semiconductor device.
Figure 10:
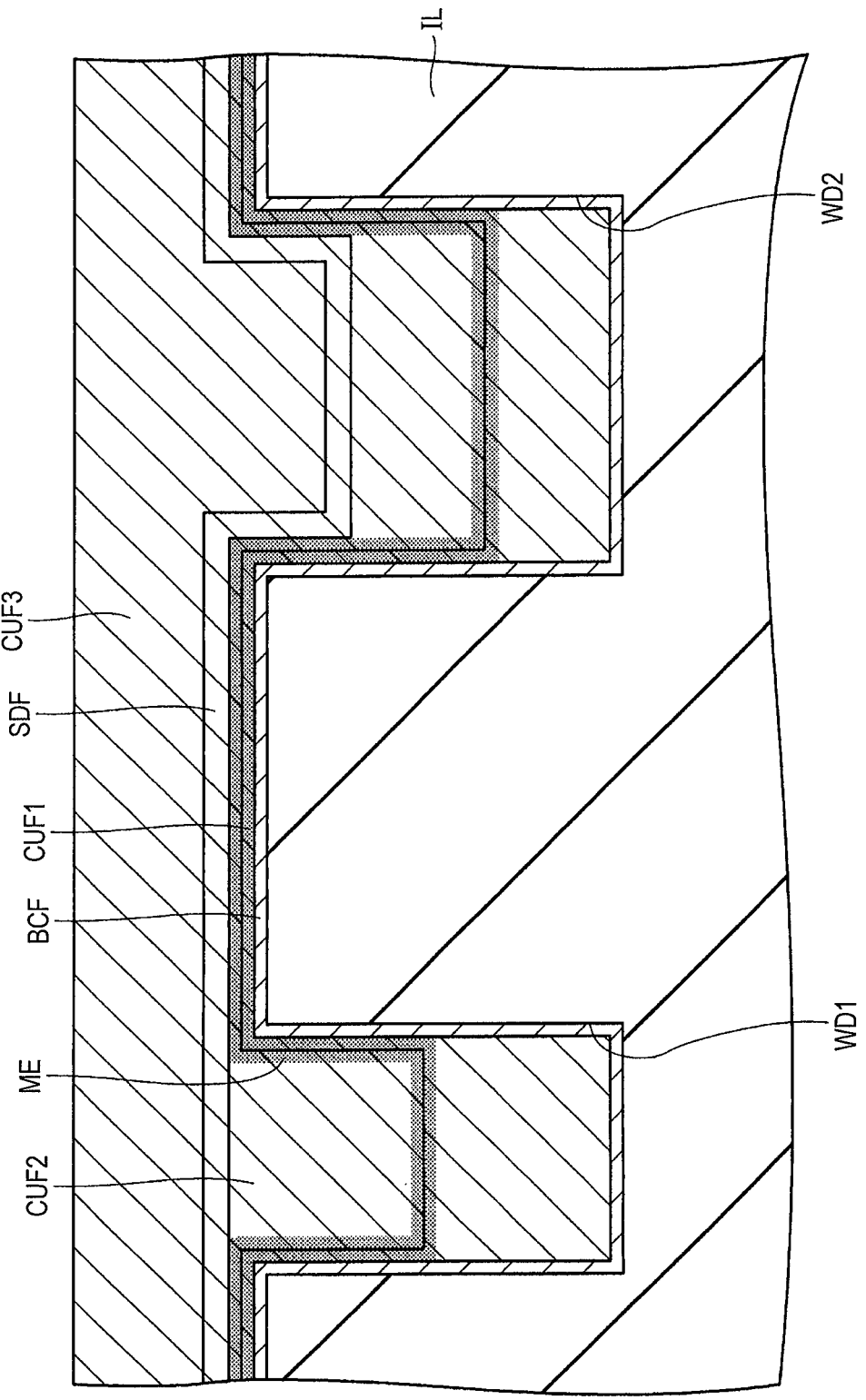
FIG. 10 is a sectional view showing a manufacturing process subsequent to FIG. 9 of the semiconductor device.
Figure 11:
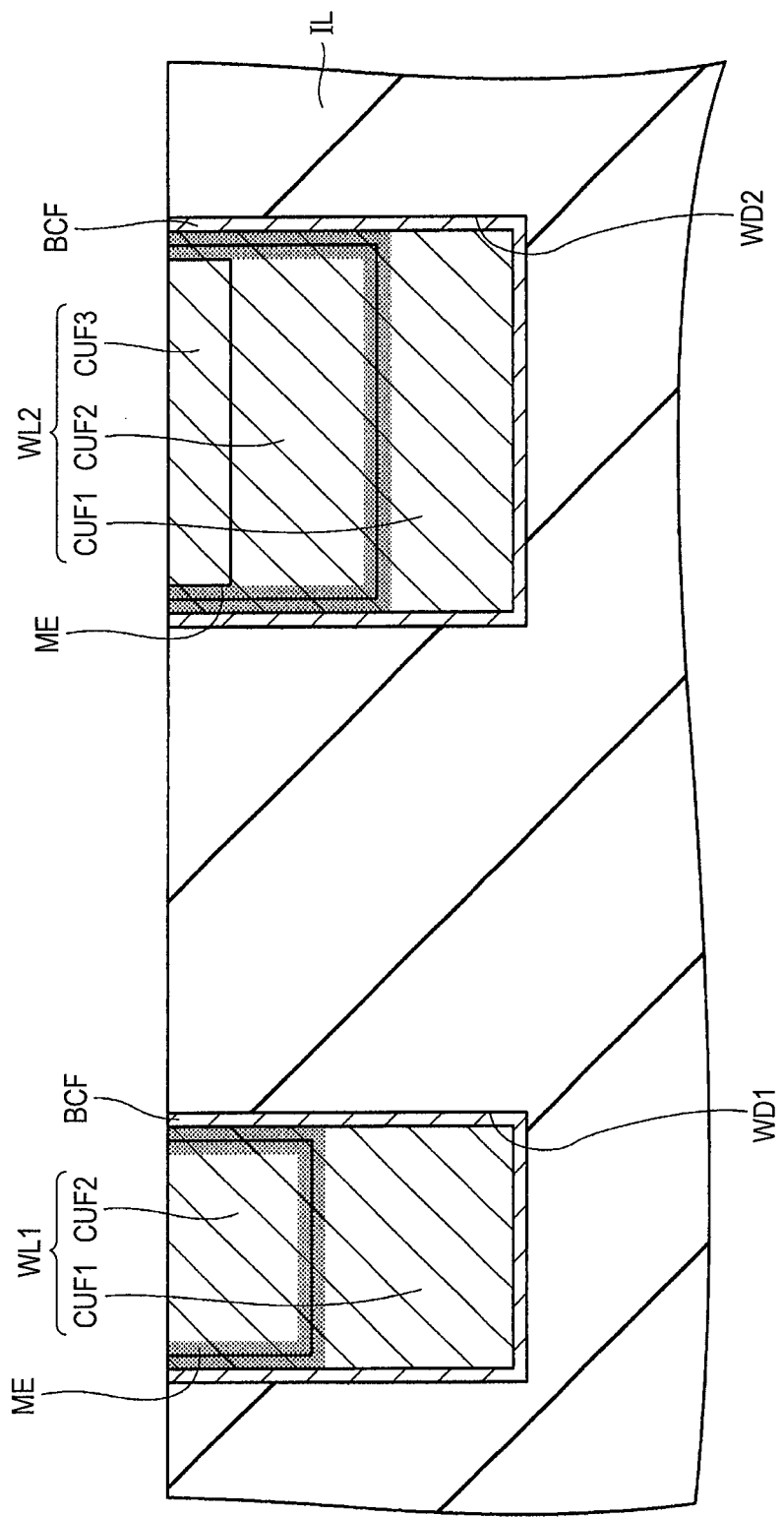
FIG. 11 is a sectional view showing a manufacturing process subsequent to FIG. 10 of the semiconductor device.

Successively, as shown in FIG. 9, a seed film SDF including copper is formed over the copper film CUF2 by a sputtering method for example. Successively, as shown in FIG. 10, a copper film CUF3 is grown over the seed film SDF by an electrolytic plating method using the seed film SDF as an electrode for example. As a result, the wiring gutter WD2 having the wider wiring width is filled with the copper film CUF1, the copper film CUF2, and the copper film CUF3. Then as shown in FIG. 11, unnecessary copper films formed over the interlayer insulating film IL are removed by a chemical mechanical polishing method (CMP method) for example. As a result, as shown in FIG. 11, it is possible to: form a copper wire WL1 including the copper film CUF1 and the copper film CUF2 embedded into the wiring gutter WD1; and also form a copper wire WL2 including the copper film CUF1, the copper film CUF2, and the copper film CUF3 embedded into the wiring gutter WD2. Thus according to First Embodiment, in the wiring gutter WD1, it is possible to segregate the metallic element having a reducing power higher than copper at the inner part of the copper wire WL1 apart from both the surface of the copper wire WL1 and the bottom face of the wiring gutter WD1 and at the side face part of the copper wire WL1 closer to the surface of the copper wire WL1 than the bottom face of the wiring gutter WD1. Likewise, according to First Embodiment, in the wiring gutter WD2, it is possible to segregate the metallic element having a reducing power higher than copper at the inner part of the copper wire WL2 apart from both the surface of the copper wire WL2 and the bottom face of the wiring gutter WD2 and at the side face part of the copper wire WL2 closer to the surface of the copper wire WL2 than the bottom face of the wiring gutter WD2. In this way, according to the manufacturing method of a semiconductor device in First Embodiment, it is possible to form the copper wire WL1 and the copper wire WL2 having such structural feature points as stated above. According to First Embodiment therefore, it is possible to manufacture a semiconductor device having a copper wire WL1 (copper wire WL2) excellent in electromigration resistance while the wiring resistance is inhibited from increasing. As a result, according to a semiconductor device manufactured by a manufacturing method according to First Embodiment, it is possible to improve the reliability of the semiconductor device while the performance of the semiconductor device is attempted to improve.

Feature of Manufacturing Method According to First Embodiment

Such a manufacturing method of a semiconductor device according to First Embodiment as stated above uses a technology called a "Cu reflow process" in the present specification and the first feature point on the manufacturing method according to First Embodiment is to use the "Cu reflow process". Concretely, the "Cu reflow process" cited in the present specification is a manufacturing technology of forming a copper film by a sputtering method over an interlayer insulating film in which a wiring gutter is formed and then pouring copper into the inner part of the wiring gutter and filling the wiring gutter by applying an annealing treatment to the copper film. By the "Cu reflow process", it is possible to obtain the advantages shown below.

For example, a copper wire formed by an ordinary damascene method is formed by forming a seed film over the inner wall of a wiring gutter formed in an interlayer insulating film and embedding a copper film into the inner part of the wiring gutter by an electrolytic plating method using the seed film as an electrode. With the advancement of the miniaturization of a copper wire however, a copper wire comes to be hardly formed by an embedding technology using an electrolytic plating method. That is, the advancement of the miniaturization of a copper wire means that the width of a wiring gutter reduces and, when the inner part of the wiring gutter having a narrow wiring width is filled by an electrolytic plating method, voids are likely to be generated at the inner part of the wiring gutter. That is, by a manufacturing technology of filling the inner part of a wiring gutter by an electrolytic plating method, it comes to be difficult to form a highly-reliable copper wire without accompanying the generation of voids.

In contrast, according to the "Cu reflow process" adopted in First Embodiment, the advantage that voids are inhibited from being generated is obtained because a wiring gutter is filled by pouring copper fluidized by an annealing treatment into the wiring gutter. That is, according to the "Cu reflow process", it is possible to obtain the advantage that a highly-reliable miniaturized copper wire can be formed without accompanying the generation of voids.

Then in First Embodiment, ingenuity is exercised further on the premise of the first feature point that is to adopt the "Cu reflow process" that allows the embedding characteristic of a miniaturized copper wire to be attempted to improve. That is, the present inventors focus attention on the fact that the deterioration of electromigration resistance becomes obvious as a problem in a miniaturized copper wire. Here, the present inventors have recognized that the increase of the wiring resistance caused by an added metallic element becomes obvious as a side effect merely by the technology of improving electromigration resistance by increasing the quantity of the metallic element different from copper added to a copper wire and have studied to solve the problem. As a result, the present inventors have obtained the knowledge that it is possible to improve the electromigration resistance of a whole copper wire if electromigration resistance can be improved at the inner part of the copper wire apart from both the surface of the copper wire and the bottom face of a wiring gutter and at the side face part of the copper wire closer to the surface of the copper wire than the bottom face of the wiring gutter. This means that it is unnecessary to add a metallic element different from copper to a whole copper wire and it is only necessary to add such a metallic element as stated above only to a site where electromigration resistance comes to be a problem. That is, the present inventors: have conceived the fundamental thought of adding a metallic element different from copper concentrically to a part of a copper wire where electromigration is likely to appear; and have found that, according to the fundamental thought, it is possible to obtain the conspicuous effect that the electromigration resistance of the copper wire can be improved without incurring the increase of wiring resistance even when the copper wire is miniaturized.

Then the present inventors have thought to make use of the "Cu reflow process" capable of improving the reliability of a miniaturized copper wire in the event of embodying the fundamental thought. Concretely, the second feature point of the manufacturing method according to First Embodiment is that a two-step "Cu reflow process" is adopted, a surface oxidation treatment is applied between a first-step "Cu reflow process" and a second-step "Cu reflow process", and a metallic element having a reducing power higher than copper is adopted as the metallic element added to copper.

According to First Embodiment therefore, firstly copper oxide is formed at a part where electromigration is likely to appear by applying a surface oxidation treatment between a first-step "Cu reflow process" and a second-step "Cu reflow process". Then a metallic element gathers around the copper oxide by an annealing treatment because oxygen is taken out of the copper oxide by adopting the metallic element having a reducing power higher than copper as the metallic element added to copper. As a result, it is possible to segregate the metallic element at the part where electromigration is likely to appear. In this way, according to the second feature point of the manufacturing method in First Embodiment, it is possible to embody the fundamental thought of adding a metallic element different from copper concentrically at the part of a copper wire where electromigration is likely to appear.

According to First Embodiment therefore, while the advantage that it is possible to attempt to improve the reliability of a miniaturized copper wire by the first feature point of adopting the "Cu reflow process" is secured, the fundamental thought in First Embodiment is embodied further by the second feature point of improving the "Cu reflow process". That is, in First Embodiment, by combining the aforementioned fundamental thought and the "Cu reflow process", it is possible to obtain a conspicuous effect that the electromigration resistance of a copper wire can be improved without incurring the increase of wiring resistance. In particular, the technological thought in First Embodiment can obtain an excellent effect that both the improvement of the performance and the improvement of the reliability of a semiconductor device can be obtained by being applied to the manufacturing technology of a miniaturized copper wire requiring the "Cu reflow process".

Second Embodiment

A feature point of Second Embodiment is that a base film LNF is formed between a barrier conductor film BCF formed over the inner wall of a wiring gutter WD1 and a copper wire WL1 embedded into the wiring gutter WD1 and also the base film LNF is formed between the barrier conductor film BCF formed over the inner wall of a wiring gutter WD2 and a copper wire WL2 embedded into the wiring gutter WD2.

Figure 12:
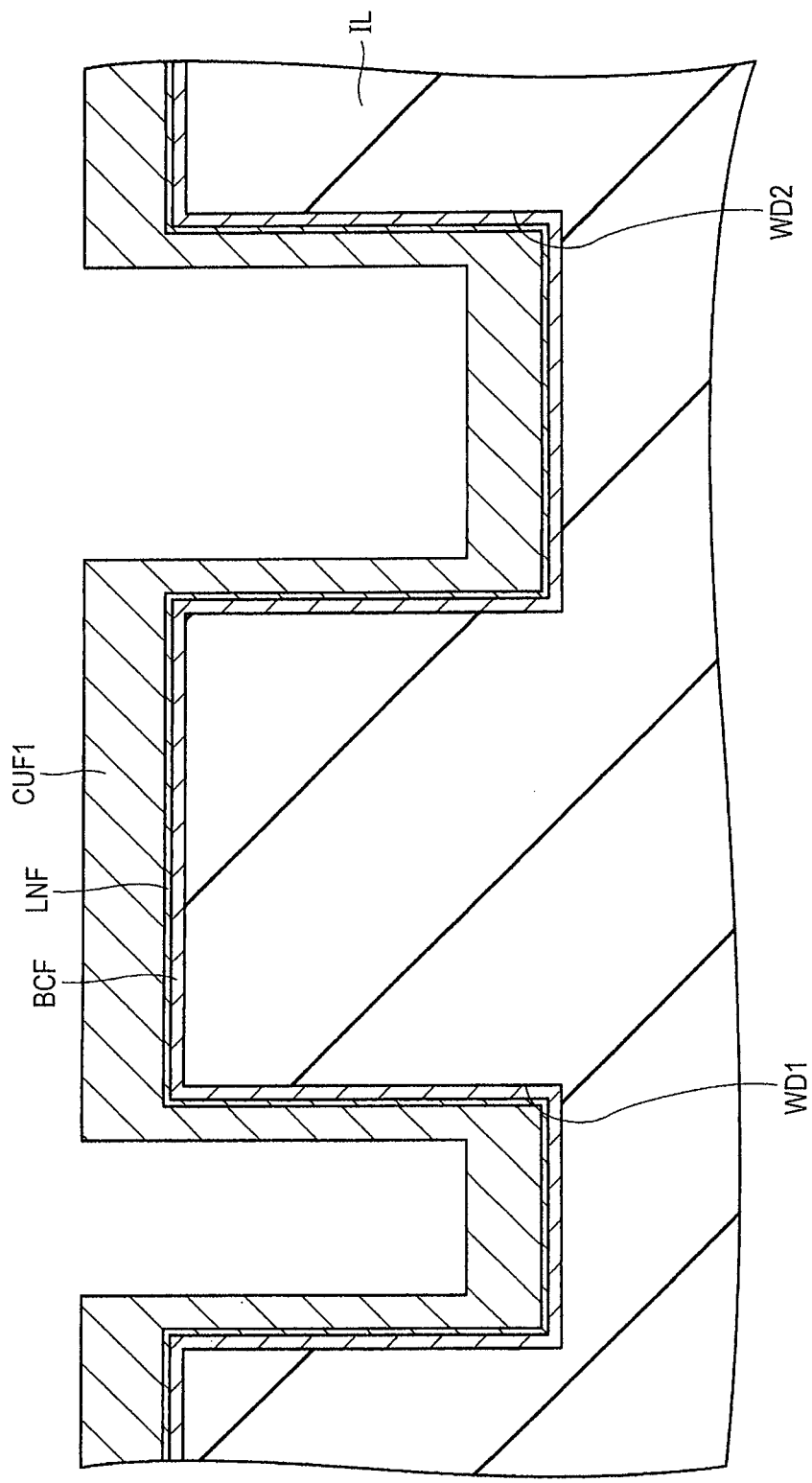
FIG. 12 is a sectional view showing a manufacturing process of a semiconductor device according to Second Embodiment.

FIG. 12 is a view in a manufacturing process of a semiconductor device according to Second Embodiment, which corresponds to FIG. 4 in the manufacturing process of a semiconductor device according to First Embodiment. As shown in FIG. 12, in Second Embodiment, a base film (liner film) LNF is formed between a barrier conductor film BCF and a copper film CUF1, those being formed over the inner wall of a wiring gutter WD1 and the inner wall of a wiring gutter WD2. Concretely, the base film LNF includes a material having a lattice constant close to the lattice constant of copper. For example, the base film LNF can include a film such as a cobalt film or a ruthenium film. By forming such a base film LNF, the fluidity improvement effect (reflow effect) of the "Cu reflow process" is accelerated. As a result, it is possible to shorten the annealing time of a "Cu reflow process" and it is thereby possible to improve the throughput at the "Cu reflow process" according to Second Embodiment.

Figure 13:
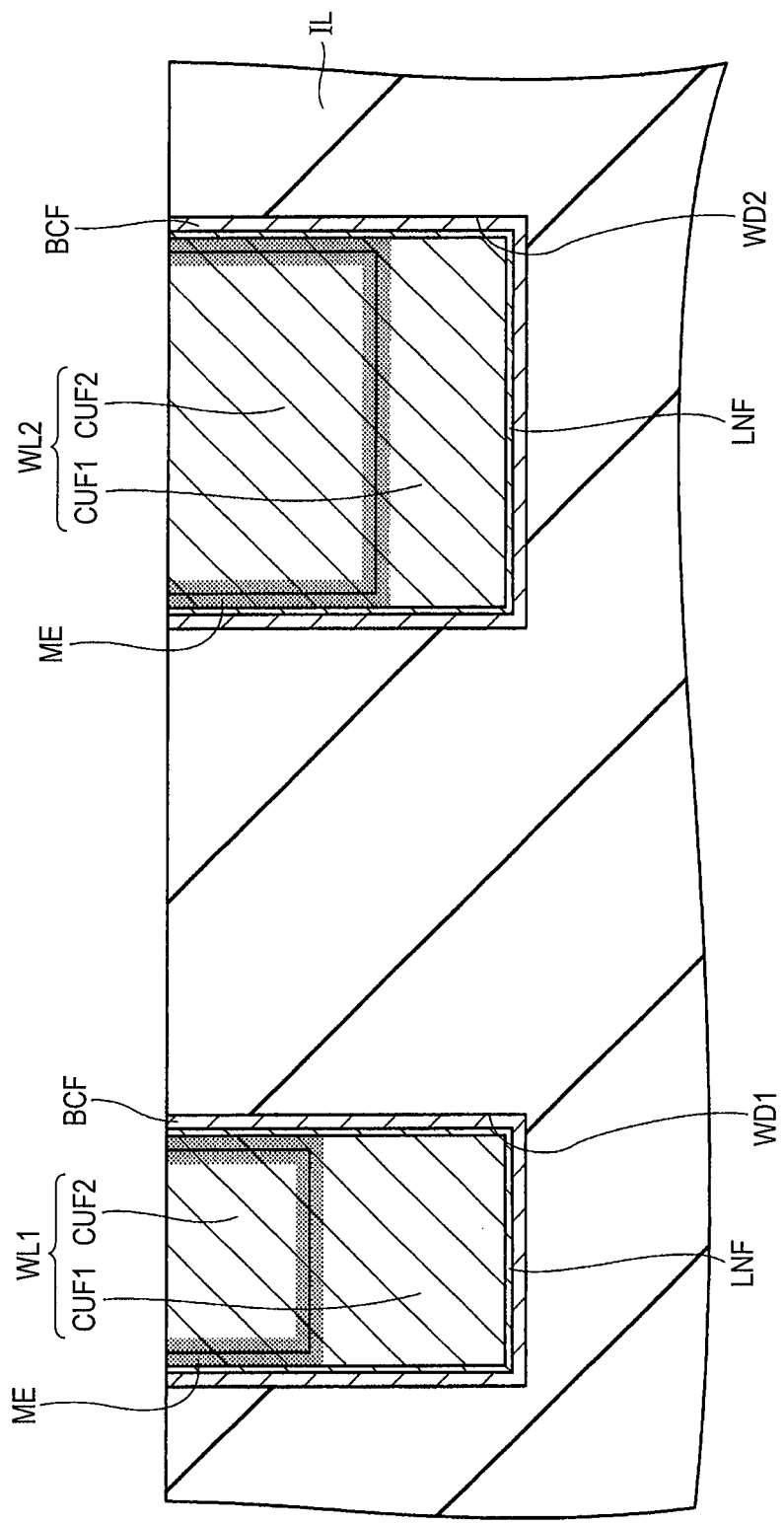
FIG. 13 is a sectional view showing a manufacturing process subsequent to FIG. 12 of the semiconductor device.

FIG. 13 is a view showing a sectional configuration of a copper wire WL1 and a copper wire WL2 manufactured by a manufacturing method of a semiconductor device according to Second Embodiment. As shown in FIG. 13, for example it is obvious that a base film LNF is interposed between a copper wire WL1 and a barrier conductor film BCF and the base film LNF is interposed also between a copper wire WL2 and the barrier conductor film BCF.

Third Embodiment

Although explanations have been made by using an atmospheric disposure treatment as an example of the oxidation treatment applied between a first-step "Cu reflow process" and a second-step "Cu reflow process" in First Embodiment, the oxidation treatment is not limited to that and it is also possible to use a treatment of exposing a semiconductor substrate in a high-pressure oxygen atmosphere, an oxygen plasma treatment, or an oxygen annealing treatment as the oxidation treatment. On this occasion for example, it is also possible to continuously apply an oxidation treatment without applying an atmospheric exposure treatment in a sputtering device in which the first-step "Cu reflow process" and the second-step "Cu reflow process" are applied. According to Third Embodiment therefore, it is possible to attempt to simplify a process sequence and improve a throughput.

Fourth Embodiment

Although explanations have been made on the basis of the example of making use of a two-step "Cu reflow process" in First Embodiment, the process is not limited to that and it is also possible to use a multistep "Cu reflow process". In Fourth Embodiment in particular, an example of using a three-step "Cu reflow process" is explained.

Figure 14:
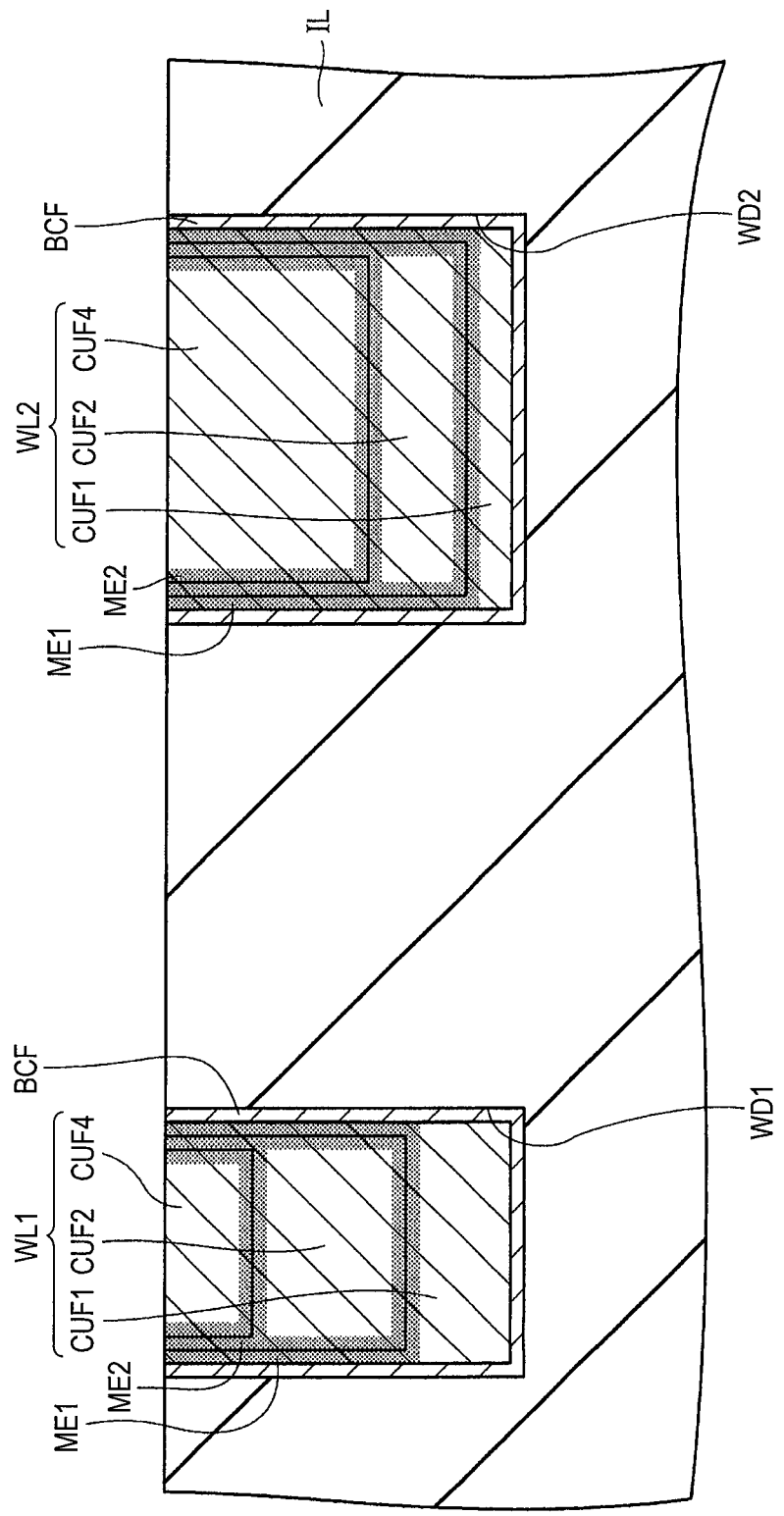
FIG. 14 is a sectional view showing a configuration of a semiconductor device according to Fourth Embodiment.

FIG. 14 is a view showing a sectional structure of a copper wire WL1 and a copper wire WL2 formed by making use of a three-step "Cu reflow process". In FIG. 14, it is obvious that a copper film CUF1, a copper film CUF2, and a copper film CUF4 are embedded into a wiring gutter WD1 and a metallic element ME1 and a metallic element ME2 segregate in the copper wire WL1 including the copper film CUF1, the copper film CUF2, and the copper film CUF4. Likewise, it is obvious that the copper film CUF1, the copper film CUF2, and the copper film CUF4 are embedded into a wiring gutter WD2 and the metallic element ME1 and the metallic element ME2 segregate in the copper wire WL2 including the copper film CUF1, the copper film CUF2, and the copper film CUF4.

In FIG. 14, a semiconductor device according to Fourth Embodiment has the wiring gutter WD1 and the wiring gutter WD2 formed in an interlayer insulating film IL, the copper wire WL1 embedded into the wiring gutter WD1, and the copper wire WL2 embedded into the wiring gutter WD2. Here, the metallic element ME1 and the metallic element ME2 having reducing powers higher than copper segregate in a plurality of discrete regions that are arranged discretely from the bottom face of the wiring gutter WD1 in the depth direction of the wiring gutter WD1 and face the bottom face of the wiring gutter WD1 respectively and over the side face of the wiring gutter WD1 above the discrete region closest to the bottom face of the wiring gutter WD1. Likewise, the metallic element ME1 and the metallic element ME2 having reducing powers higher than copper segregate in a plurality of discrete regions that are arranged discretely from the bottom face of the wiring gutter WD2 in the depth direction of the wiring gutter WD2 and face the bottom face of the wiring gutter WD2 respectively and over the side face of the wiring gutter WD2 above the discrete region closest to the bottom face of the wiring gutter WD2.

The copper wire WL1 and the copper wire WL2 according to Fourth Embodiment configured in this way are formed by further applying a third-step "Cu reflow process" after the two-step "Cu reflow process" explained in First Embodiment is applied. Concretely, at the third-step "Cu reflow process", after the second-step "Cu reflow process" is applied, the surface of the copper film CUF2 is oxidized by applying an oxidation treatment and successively the copper film CUF4 containing a metallic element is formed over the copper film CUF2 by a sputtering method. Then after the processes, by applying an annealing treatment to the semiconductor substrate, a part of the copper and a part of the metallic element, those including the copper film CUF4, flow into the inner part of the wiring gutter WD1 and the inner part of the wiring gutter WD2, the film thickness of the copper film CUF4 formed in the inner part of the wiring gutter WD1 is increased from the film thickness before the annealing treatment, and the film thickness of the copper film CUF4 formed in the inner part of the wiring gutter WD2 is increased from the film thickness before the annealing treatment. The succeeding processes are nearly identical to First Embodiment. In this way, the copper wire WL1 and the copper wire WL2 according to Fourth Embodiment can be formed.

According to Fourth Embodiment, since the quantities of the metallic elements segregating in the inner parts of the copper wire WL1 and the copper wire WL2 increase, it is possible to improve electromigration resistance further and improve the reliability of the copper wire WL1 and the copper wire WL2 accordingly.

Fifth Embodiment

Although explanations have been made on the basis of the example of applying the technological thought in First Embodiment to a single damascene method of forming a copper wire in First Embodiment, the technological thought in First Embodiment is not limited to that and can be applied also to a dual damascene method of forming a copper wire and a plug together for example. In Fifth Embodiment, an example of adopting the technological thought in First Embodiment to a dual damascene method is explained.

Figure 15:
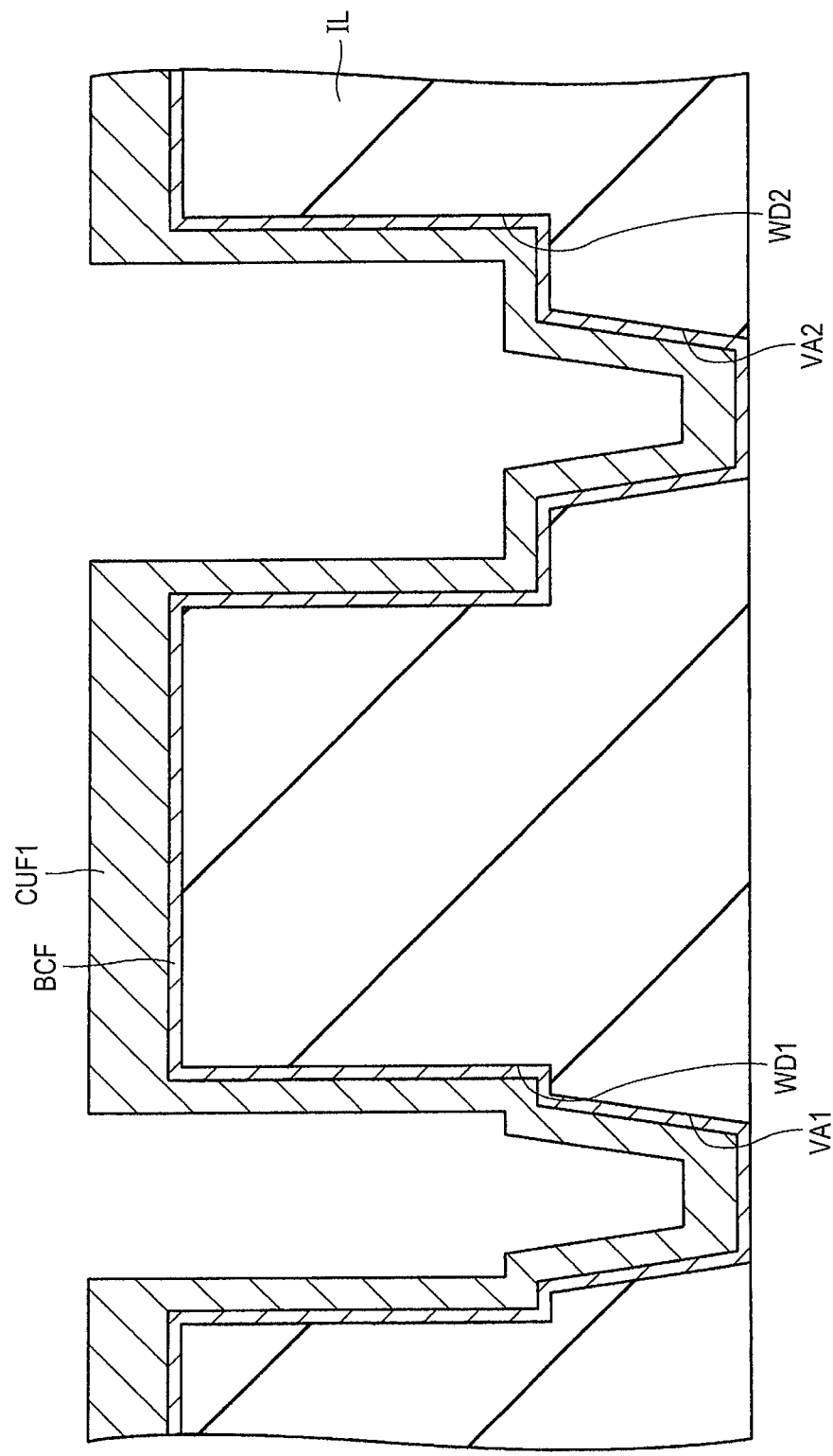
FIG. 15 is a sectional view showing a manufacturing process of a semiconductor device according to Fifth Embodiment.

Firstly as shown in FIG. 15, a via VA1 and a wiring gutter WD1 are formed integrally and a via VA2 and a wiring gutter WD2 are formed integrally in an interlayer insulating film IL by a photolithography technology and an etching technology. Successively, a barrier conductor film BCF is formed over the interlayer insulating film IL including the inner wall of the via VA1, the inner wall of the wiring gutter WD1, the inner wall of the via VA2, and the inner wall of the wiring gutter WD2 by a sputtering method for example.

Then in the state of carrying a semiconductor substrate in a sputtering device, a copper film CUF1 containing a metallic element having a reducing power higher than copper is formed over the interlayer insulating film IL including the inner wall of the via VA1, the inner wall of the wiring gutter WD1, the inner wall of the via VA2, and the inner wall of the wiring gutter WD2 with the barrier conductor film BCF interposed by a sputtering method using a target containing copper and the metallic element having a reducing power higher than copper.

Figure 16:
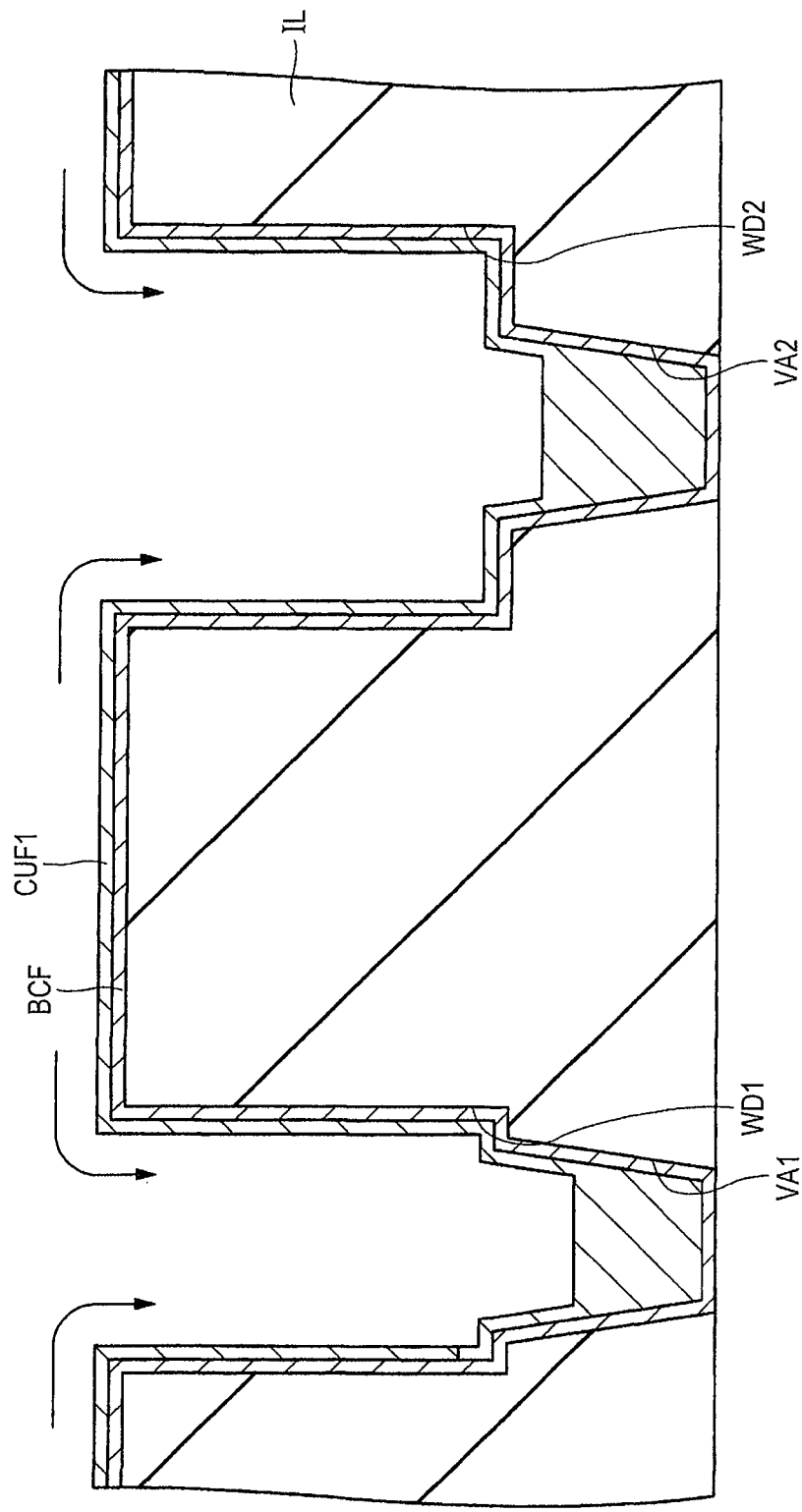
FIG. 16 is a sectional view showing a manufacturing process subsequent to FIG. 15 of the semiconductor device.

Successively, in the state of carrying the semiconductor substrate in the sputtering device, as shown in FIG. 16, an annealing treatment (heat treatment) is applied to the semiconductor substrate. As a result, a part of the copper and a part of the metallic element, those including the copper film CUF1, flow from over the interlayer insulating film IL into the inner part of the via VA1, the inner part of the wiring gutter WD1, the inner part of the via VA2, and the inner part of the wiring gutter WD2 and the film thicknesses of the copper film CUF1 formed in the inner part of the via VA1 and the inner part of the via VA2 are increased from the film thicknesses before the annealing treatment. The annealing temperature on this occasion can be set at 300° C. or higher to 400° C. or lower for example.

Figure 17:
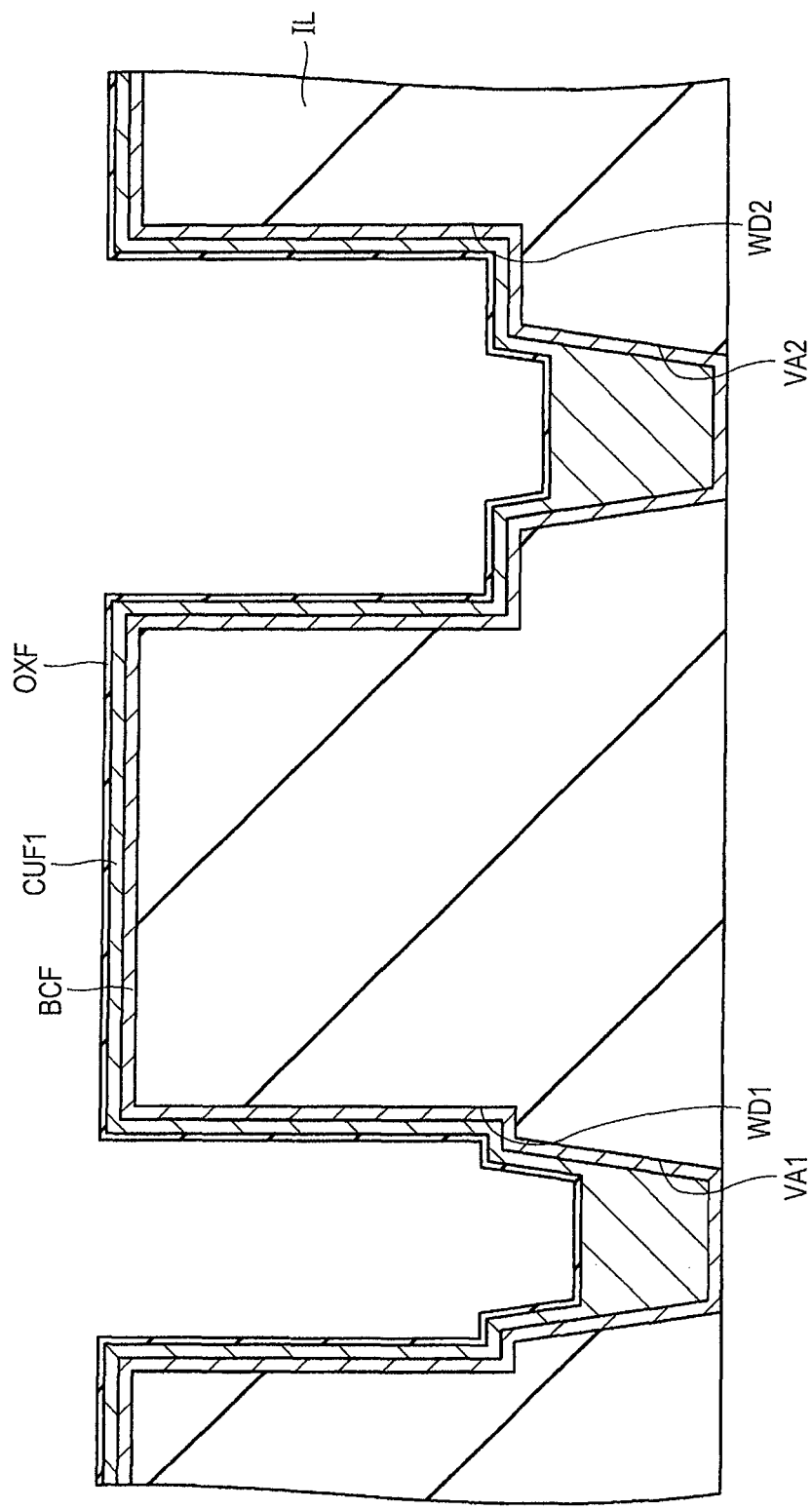
FIG. 17 is a sectional view showing a manufacturing process subsequent to FIG. 16 of the semiconductor device.

Successively, an atmospheric exposure treatment is applied by carrying the semiconductor substrate from the sputtering device to the exterior. The atmospheric exposure treatment is a kind of oxidation treatment and the surface of the copper film CUF1 is oxidized by the atmospheric exposure treatment as shown in FIG. 17. That is, at the surface of the copper film CUF1, copper binds to oxygen and a copper oxide film OXF is formed.

Figure 18:
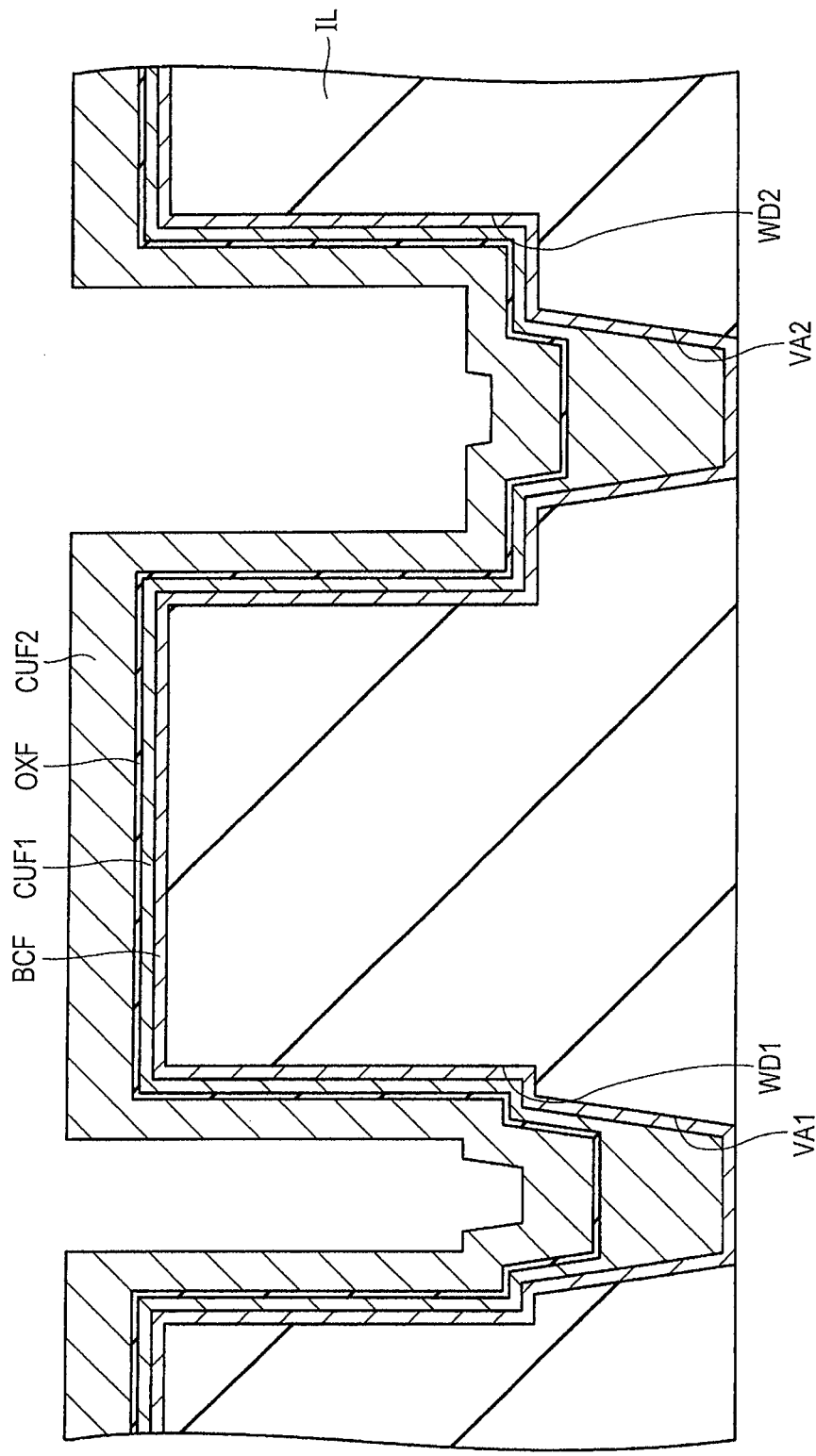
FIG. 18 is a sectional view showing a manufacturing process subsequent to FIG. 17 of the semiconductor device.

Successively, after the semiconductor substrate is carried in the sputtering device again, as shown in FIG. 18, a copper film CUF2 containing a metallic element having a reducing power higher than copper is formed over the copper film CUF1 by a sputtering method using a target containing copper and the metallic element having a reducing power higher than copper.

Figure 19:
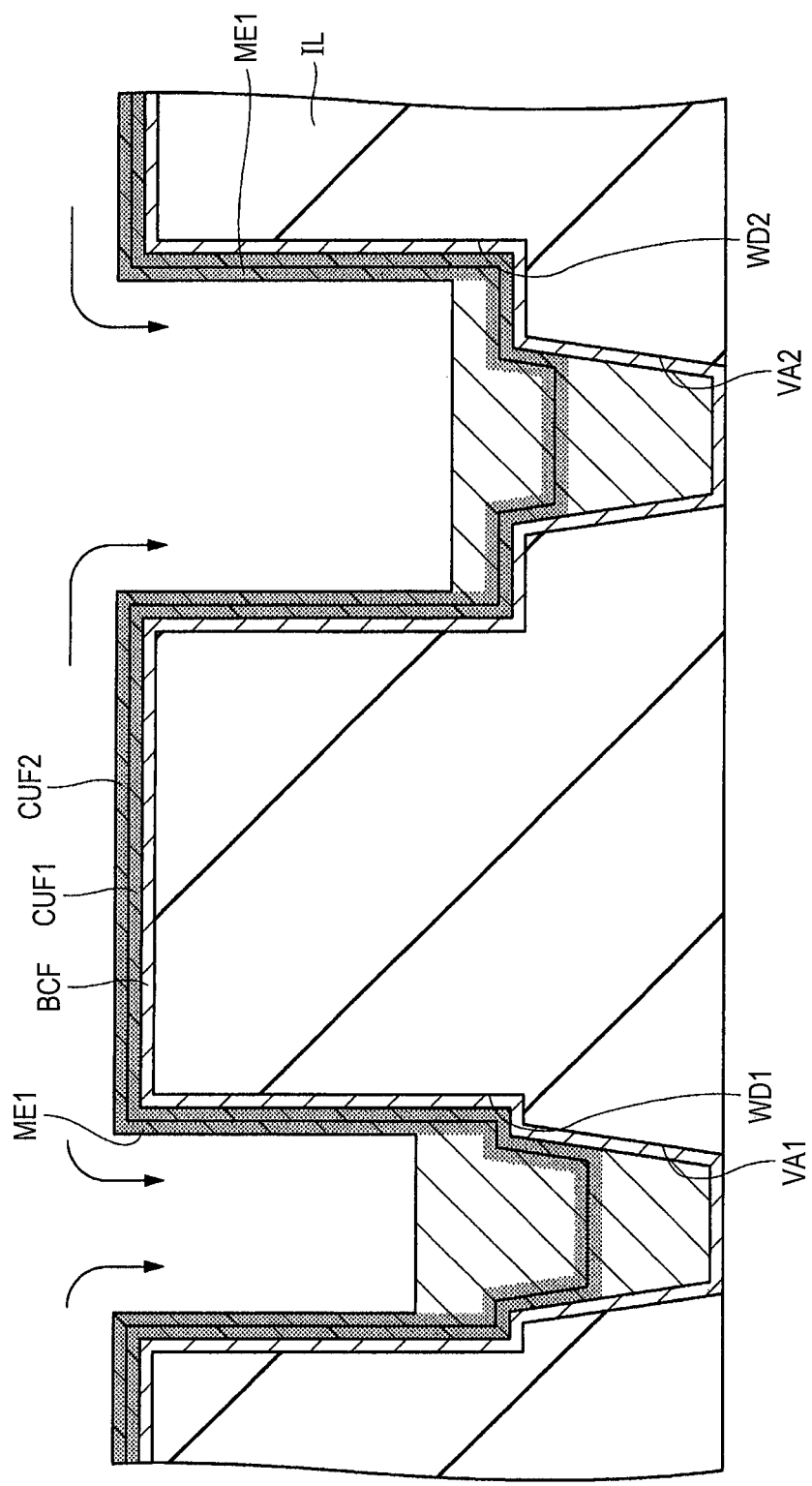
FIG. 19 is a sectional view showing a manufacturing process subsequent to FIG. 18 of the semiconductor device.

Successively, in the state of carrying the semiconductor substrate in the sputtering device, as shown in FIG. 19, an annealing treatment (heat treatment) is applied to the semiconductor substrate. As a result, a part of the copper and a part of the metallic element, those including the copper film CUF2, flow from over the copper film CUF1 formed over the interlayer insulating film IL into the inner part of the via VA1, the inner part of the wiring gutter WD1, the inner part of the via VA2, and the inner part of the wiring gutter WD2 and the film thicknesses of the copper film CUF2 formed in the inner part of the via VA1, the inner part of the wiring gutter WD1, the inner part of the via VA2, and the inner part of the wiring gutter WD2 are increased from the film thicknesses before the annealing treatment. As a result, the via VA1 and the via VA2 are filled completely by the copper film CUF1 and the copper film CUF2. The annealing temperature of the annealing treatment here can be set at 300° C. or higher to 400° C. or lower for example.

Here, by the annealing treatment for fluidizing the copper film CUF2, the metallic element ME contained in the already-formed copper film CUF1 and the metallic element ME contained in the copper film CUF2 segregate at the interface between the copper film CUF1 and the copper film CUF2 in the via VA1 and the wiring gutter WD1. Likewise, the metallic element ME contained in the already-formed copper film CUF1 and the metallic element ME contained in the copper film CUF2 segregate at the interface between the copper film CUF1 and the copper film CUF2 also in the via VA2 and the wiring gutter WD2.

Figure 20:
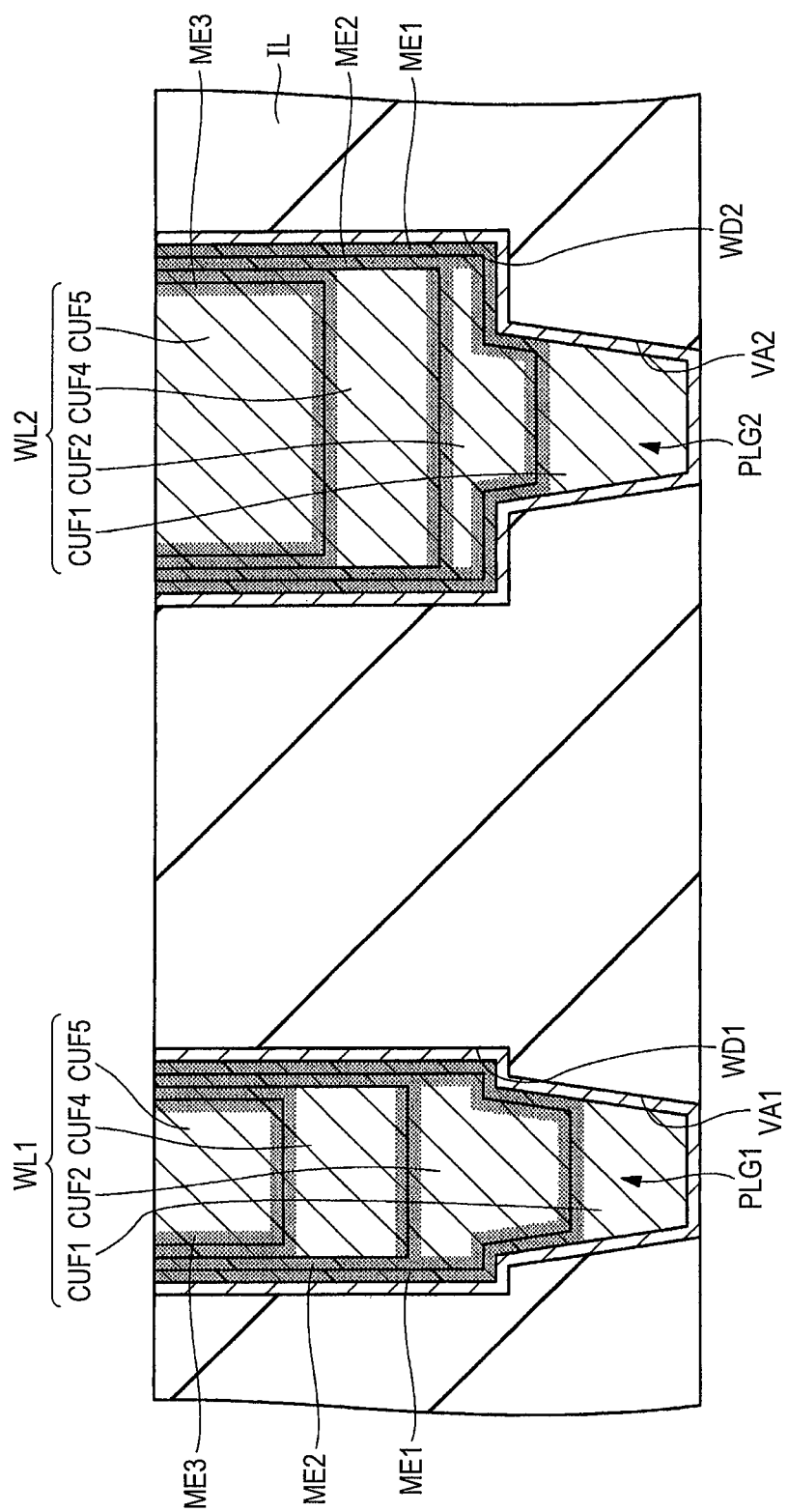
FIG. 20 is a sectional view showing a manufacturing process subsequent to FIG. 19 of the semiconductor device.

Successively, by repeating the "Cu reflow process", it is possible to form a plug PLG1 and a copper wire WL1 integrally and also a plug PLG2 and a copper wire WL2 integrally according to Fifth Embodiment. Concretely, as shown in FIG. 20, the integrally-formed plug PLG1 and copper wire WL1 include the copper film CFU1, the copper film CFU2, a copper film CFU4, and a copper film CFU5 and metallic elements (metallic element ME1, metallic element ME2, and metallic element ME3) segregate in the respective boundary regions. Likewise, the integrally-formed plug PLG2 and copper wire WL2 include the copper film CFU1, the copper film CFU2, the copper film CFU4, and the copper film CFU5 and the metallic elements (metallic element ME1, metallic element ME2, and metallic element ME3) segregate in the respective boundary regions. In this way, it is possible to manufacture a semiconductor device according to Fifth Embodiment.

According to Fifth Embodiment, in FIG. 20 for example, when attention is focused on the integrally-formed via VA1 and copper wire WL1, the metallic elements segregate in not only the copper wire WL1 but also the via VA1. Likewise, when attention is focused on the integrally-formed via VA2 and copper wire WL2, the metallic elements segregate in not only the copper wire WL2 but also the via VA2. As a result, according to Fifth Embodiment, it is possible to improve not only the electromigration resistance of the copper wire WL1 and the copper wire WL2 but also the electromigration resistance of the via VA1 and the via VA2. That is, according to Fifth Embodiment, by applying the technological thought in First Embodiment to a dual damascene method, it is possible to improve not only the reliability of the copper wire WL1 and the copper wire WL2 but also the reliability of the via VA1 and the via VA2.

Although the invention established by the present inventors has heretofore been explained concretely on the basis of the embodiments, it goes without saying that the present invention is not limited to the embodiments and can be modified variously within the scope not departing from the tenor of the present invention.

The above embodiments include the following embodiments.

(Additional Statement 1)

A manufacturing method of a semiconductor device including the steps of:

(a) forming an insulating film above a semiconductor substrate;

(b) forming a first wiring gutter and a second wiring gutter having a width larger than the first wiring gutter in the insulating film;

(c) forming a first copper film containing a metallic element having a reducing power higher than copper over the insulating film including the inner wall of the first wiring gutter and the inner wall of the second wiring gutter by a sputtering method;

(d) by applying a first annealing treatment, pouring a part of the copper and a part of the metallic element, those including the first copper film, from over the insulating film into the inner part of the first wiring gutter and the inner part of the second wiring gutter and increasing the film thicknesses of the first copper film formed at the inner part of the first wiring gutter and the inner part of the second wiring gutter from the film thicknesses before the first annealing treatment;

(e) after the step (d), oxidizing the surface of the first copper film by applying a first oxidation treatment;

(f) after the step (e), forming a second copper film containing the metallic element over the first copper film by a sputtering method;

(g) after the step (f), by applying a second annealing treatment, pouring a part of the copper and a part of the metallic element, those including the second copper film, into the inner part of the first wiring gutter and the inner part of the second wiring gutter, increasing the film thicknesses of the second copper film formed at the inner part of the first wiring gutter and the inner part of the second wiring gutter from the film thicknesses before the second annealing treatment, and thus filling the inner part of the first wiring gutter with the first copper film and the second copper film; and (h) after the step (g), filling the inner part of the second wiring gutter with the first copper film, the second copper film, and a third copper film by forming the third copper film over the second copper film.

(Additional Statement 2)

A manufacturing method of a semiconductor device according to Additional statement 1, wherein, at the step (h), the third copper film is formed by a plating method.

What is claimed is:

1. A semiconductor device comprising:
an insulating film formed above a semiconductor substrate,
a wiring gutter formed in the insulating film, and
a copper wire embedded in the wiring gutter, and the copper wire including a first copper film disposed over a bottom face of the wiring gutter and a second copper film disposed over the first copper film,
wherein, in a sectional view, a metallic element having a reducing power higher than copper segregates the first copper film and the second copper film at an inner part of the copper wire apart from both an upper surface of the copper wire and the bottom face of the wiring gutter and at a side face part of the copper wire closer to the upper surface of the copper wire than the bottom face of the wiring gutter, and wherein the metallic element is oxidized in the copper wire.

2. A semiconductor device according to claim 1,
wherein the metallic element binds to oxygen.

3. A semiconductor device according to claim 1, wherein the metallic element is any one of titanium, manganese, tin, nickel, iron, zinc, and magnesium.

4. A semiconductor device according to claim 1,
wherein the wiring width of the wiring gutter is 60 nm or less.

5. A semiconductor device according to claim 1,
wherein a barrier conductor film is interposed between the wiring gutter and the copper wire.

6. A semiconductor device according to claim 5,
wherein the barrier conductor film comprises a tantalum nitride film formed over the inner wall of the wiring gutter and a tantalum film formed over the tantalum nitride film.

7. A semiconductor device according to claim 5,
wherein a base film is interposed between the barrier conductor film and the copper wire.

8. A semiconductor device according to claim 7,
wherein the base film comprises either a cobalt film or a ruthenium film.

9. A semiconductor device according to claim 1,
wherein the metallic element has the function of inhibiting the electromigration of the copper wire.

10. A semiconductor device comprising:
an insulating film formed above a semiconductor substrate,
a wiring gutter formed in the insulating film, and
a copper wire embedded in the wiring gutter, and the copper wire has a plurality of copper films including a first copper film disposed over a bottom face of the wiring gutter and a second copper film disposed over the first copper film,
wherein a metallic element having a reducing power higher than copper segregates the plurality of copper films in a plurality of discrete regions in the copper wire which are arranged discretely from the bottom face of the wiring gutter in a thickness direction of the copper wire at an inner part of the copper wire apart from both an upper surface of the copper wire and the bottom face of the wiring gutter and at a side face part of the wiring gutter above one of the discrete regions closest to the bottom face of the wiring gutter.

* * * * *